US012666629B2

(12) United States Patent
Lu et al.

(10) Patent No.: US 12,666,629 B2
(45) Date of Patent: Jun. 23, 2026

(54) 3D IC STRUCTURE

(71) Applicant: ETRON TECHNOLOGY, INC.,
Hsinchu (TW)

(72) Inventors: Chao-Chun Lu, Hsinchu (TW);
Ming-Hong Kuo, Hsinchu (TW)

(73) Assignee: ETRON TECHNOLOGY, INC.,
Hsinchu (TW)

( * ) Notice: Subject to any disclaimer, the term of this
patent is extended or adjusted under 35
U.S.C. 154(b) by 0 days.

(21) Appl. No.: 19/280,988

(22) Filed: Jul. 25, 2025

(65) Prior Publication Data

US 2025/0372553 A1    Dec. 4, 2025

Related U.S. Application Data

(63) Continuation-in-part of application No. 19/059,275,
filed on Feb. 21, 2025, which is a continuation-in-part
of application No. 18/471,670, filed on Sep. 21, 2023.

(Continued)

(51) Int. Cl.
H01L 23/00        (2006.01)
H01L 23/48        (2006.01)
(Continued)

(52) U.S. Cl.
CPC ............ H10B 80/00 (2023.02); H10W 20/20
(2026.01); H10W 70/635 (2026.01);
(Continued)

(58) Field of Classification Search
CPC . H01L 24/06; H01L 23/481; H01L 23/49827;
H01L 25/04; H01L 2224/06135;
(Continued)

(56) References Cited

U.S. PATENT DOCUMENTS 11,239,169 B1    2/2022  Kirby
11,557,541 B2    1/2023  Hossain et al.
(Continued)

FOREIGN PATENT DOCUMENTS

JP        2016-004896 A        1/2016

OTHER PUBLICATIONS

English translation of the Search Report appended to Office Action
issued by TIPO dated Apr. 21, 2025 for TW112136128.
(Continued)

*Primary Examiner* — Peniel M Gumedzoe
(74) *Attorney, Agent, or Firm* — Birch, Stewart, Kolasch
& Birch, LLP

(57)        ABSTRACT

An IC structure includes a first memory stack including a
plurality of semiconductor die. The plurality of semicon-
ductor memory dies horizontally separate with each other,
wherein each semiconductor die includes a top surface, a
bottom surface opposite to the top surface, and four side-
walls with a first sidewall, a second sidewall, a third sidewall
and a fourth sidewall, and a plurality of edge pads located on
the first sidewall and arranged in multiple rows or two
dimensions. The area of the bottom surface or the top surface
is larger than that of any sidewall. A first part of the plurality
of edge pads is located within a upper portion of the first
sidewall of the semiconductor die, a second part of the
plurality of edge pads is located within a lower portion of the
first sidewall of the semiconductor die.

10 Claims, 20 Drawing Sheets

Related U.S. Application Data

(60) Provisional application No. 63/825,508, filed on Jun. 17, 2025, provisional application No. 63/716,506, filed on Nov. 5, 2024, provisional application No. 63/409,852, filed on Sep. 26, 2022.

(51) Int. Cl.

| | |
|---|---|
| *H01L 23/498* | (2006.01) |
| *H01L 25/04* | (2023.01) |
| *H10B 80/00* | (2026.01) |
| *H10W 20/20* | (2026.01) |
| *H10W 70/63* | (2026.01) |
| *H10W 90/00* | (2026.01) |
| *H10W 72/90* | (2026.01) |
| *H10W 90/20* | (2026.01) |

(52) U.S. Cl.
 CPC ........ *H10W 90/00* (2026.01); *H10W 72/9445* (2026.01); *H10W 90/20* (2026.01)

(58) Field of Classification Search
 CPC ......... H01L 2224/06555; H10B 80/00; H10W 90/00; H10W 90/20; H10W 70/635; H10W 20/20; H10W 72/9445
 See application file for complete search history.

(56) References Cited

U.S. PATENT DOCUMENTS

| | | | |
|---|---|---|---|
| 2003/0146012 A1* | 8/2003 | Song | H01L 24/24 |
| | | | 174/558 |
| 2012/0233510 A1* | 9/2012 | Colgan | G11C 5/025 |
| | | | 365/51 |
| 2014/0376323 A1 | 12/2014 | Terada | |
| 2015/0091179 A1 | 4/2015 | Shenoy et al. | |
| 2017/0278833 A1 | 9/2017 | Park et al. | |
| 2018/0114773 A1* | 4/2018 | Chiu | H01L 24/25 |
| 2018/0233452 A1 | 8/2018 | Lin et al. | |
| 2020/0006246 A1 | 1/2020 | Kong et al. | |
| 2020/0395346 A1* | 12/2020 | Jung | H05K 1/181 |
| 2023/0042063 A1* | 2/2023 | Bae | H01L 25/0657 |
| 2023/0238300 A1 | 7/2023 | Zhou et al. | |
| 2024/0099030 A1 | 3/2024 | Huang et al. | |

OTHER PUBLICATIONS

Office Action issued by TIPO dated Apr. 21, 2025 for TW112136128.
Office Action of U.S. Appl. No. 19/062,467 issued by USPTO on May 21, 2025.
Office Action of U.S. Appl. No. 19/062,566 issued by USPTO on Feb. 25, 2025.

\* cited by examiner

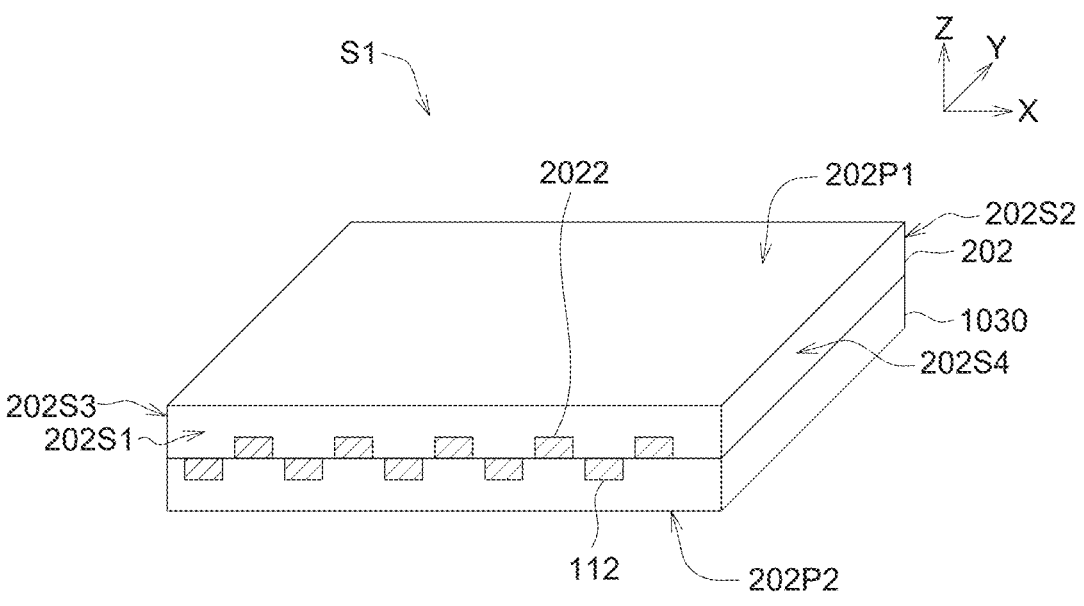
FIG. 3(a)_1
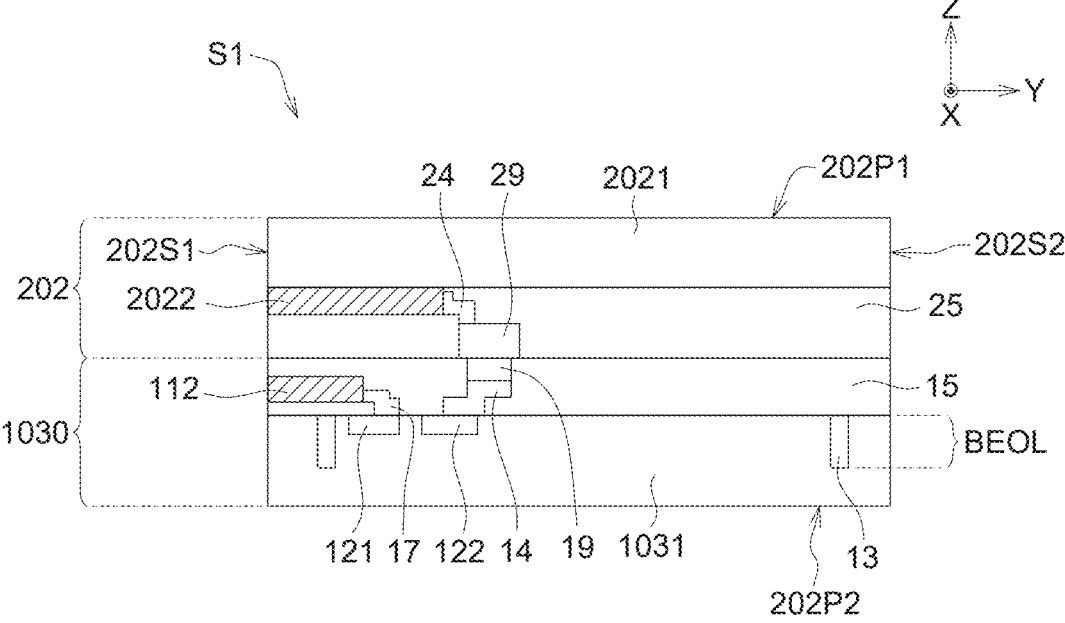
FIG. 3(a)_2

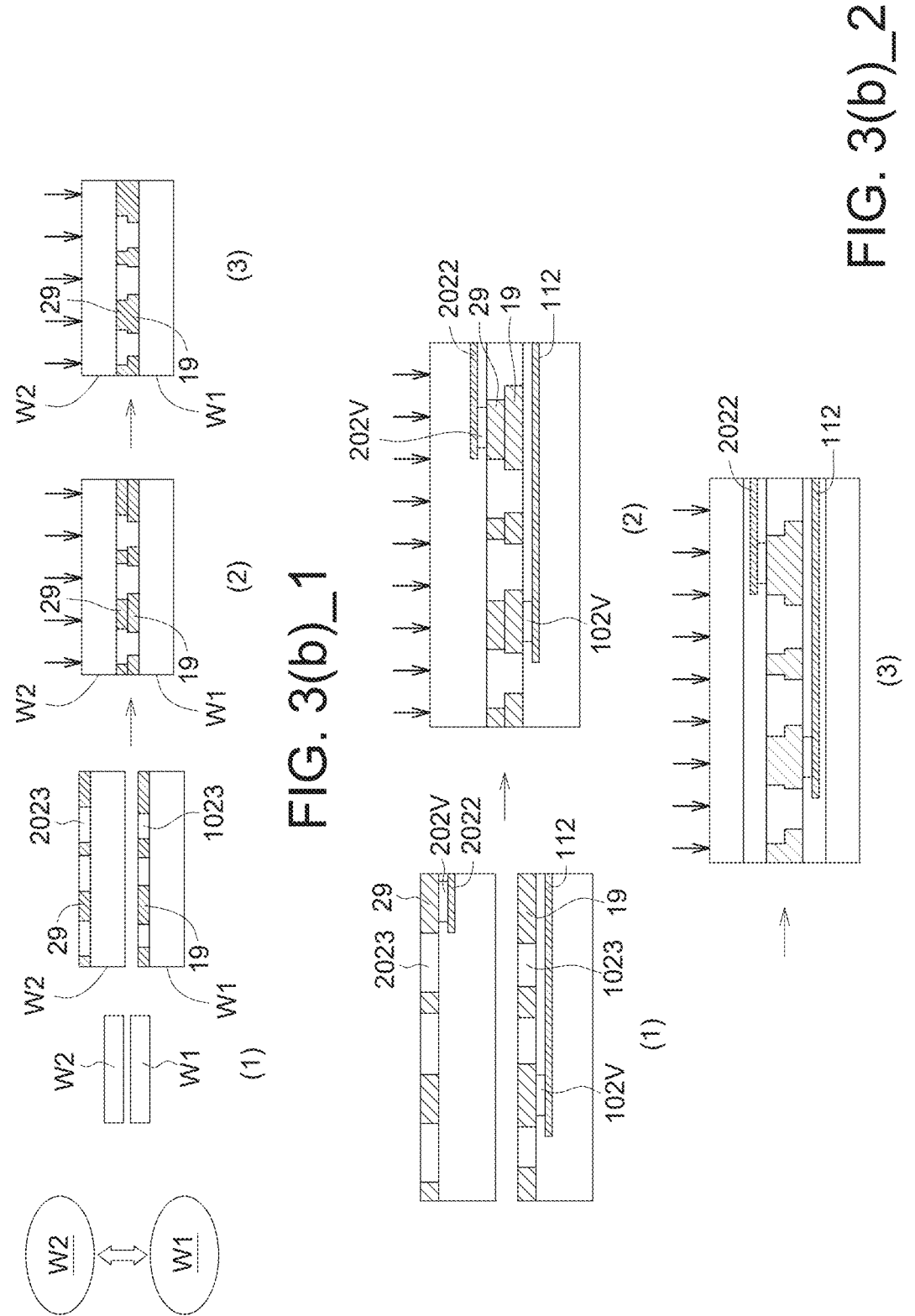
FIG. 3(b)_1
FIG. 3(b)_2

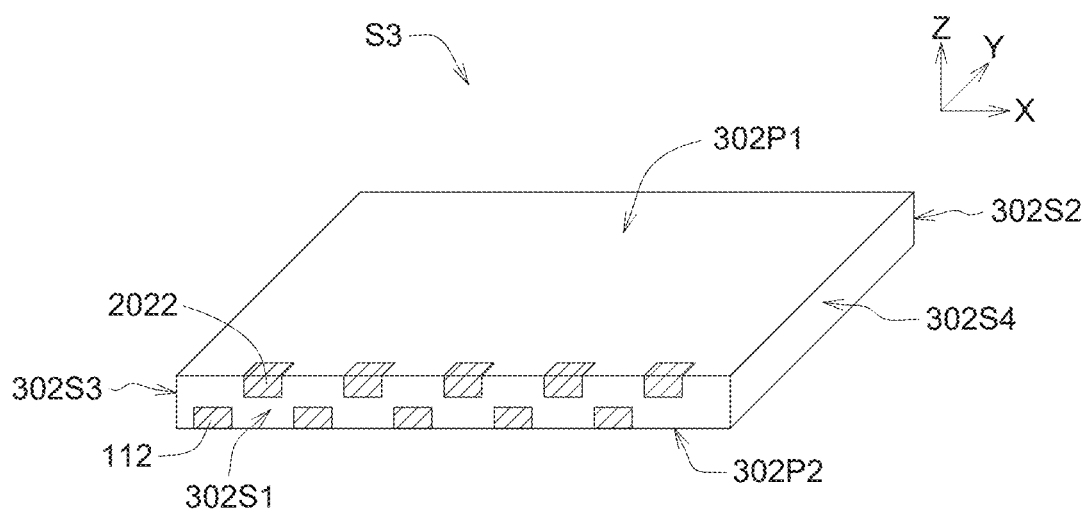
FIG. 4(a)_1
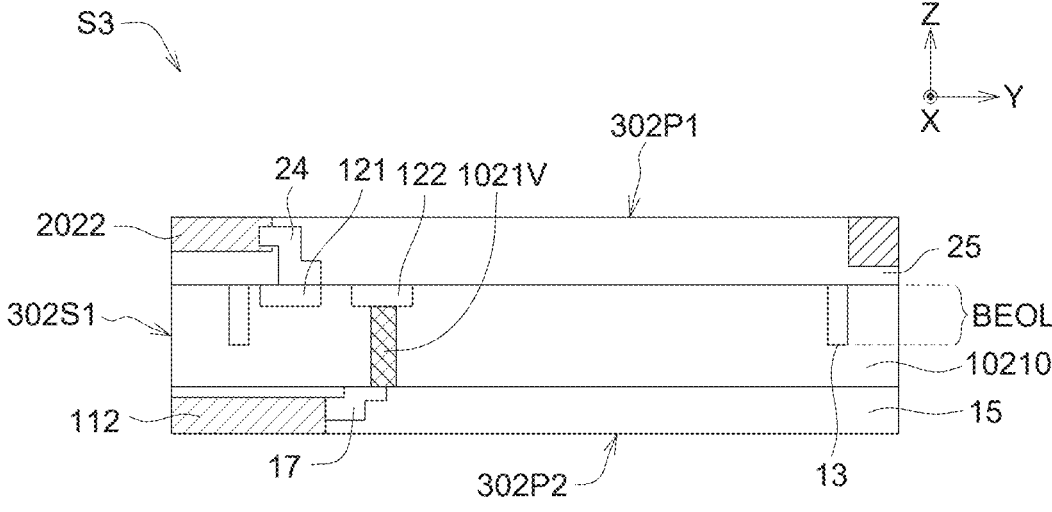
FIG. 4(a)_2

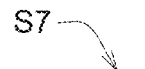
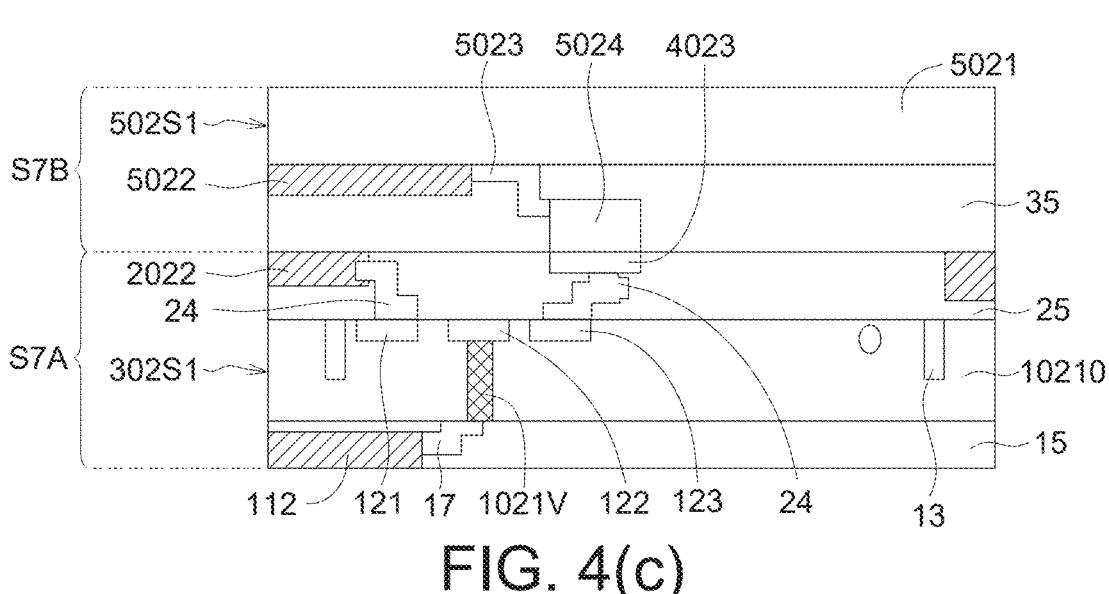
S7
S7B { 502S1, 5022 }
S7A { 2022, 24, 302S1 }
5023  5024  4023  5021
35
25
10210
15
112  121  17  1021V  122  123  24  13
FIG. 4(c)
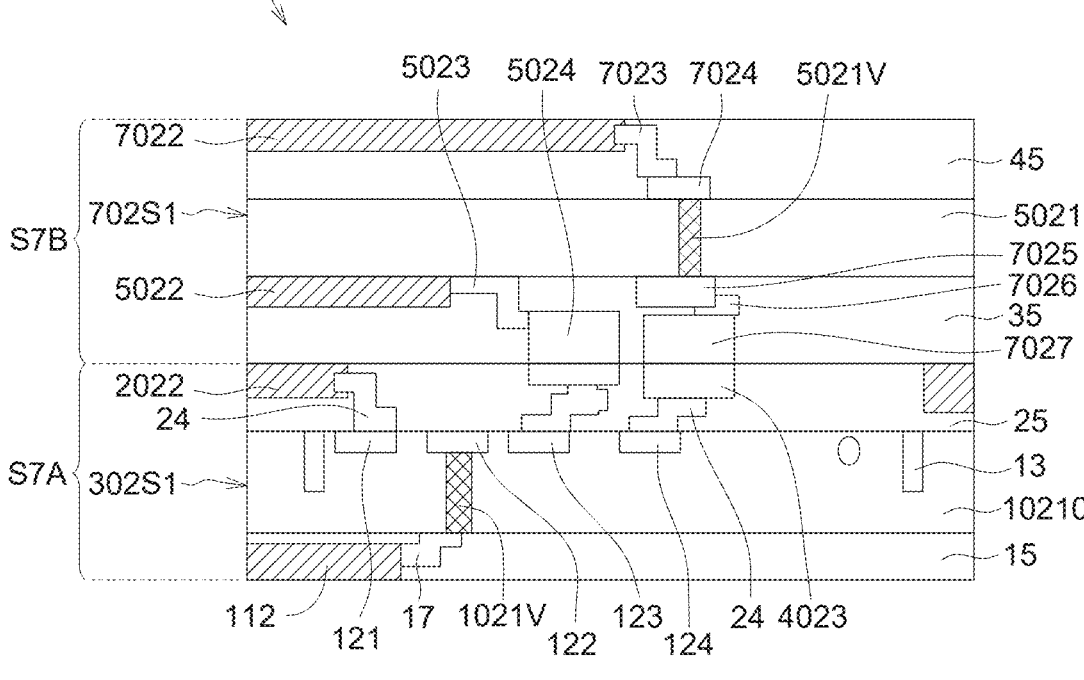
S9
S7B { 7022, 702S1, 5022 }
S7A { 2022, 24, 302S1 }
5023  5024  7023  7024  5021V
7022
45
5021
7025
7026
35
7027
25
13
10210
15
112  121  17  1021V  122  123  124  24  4023
FIG. 4(d)

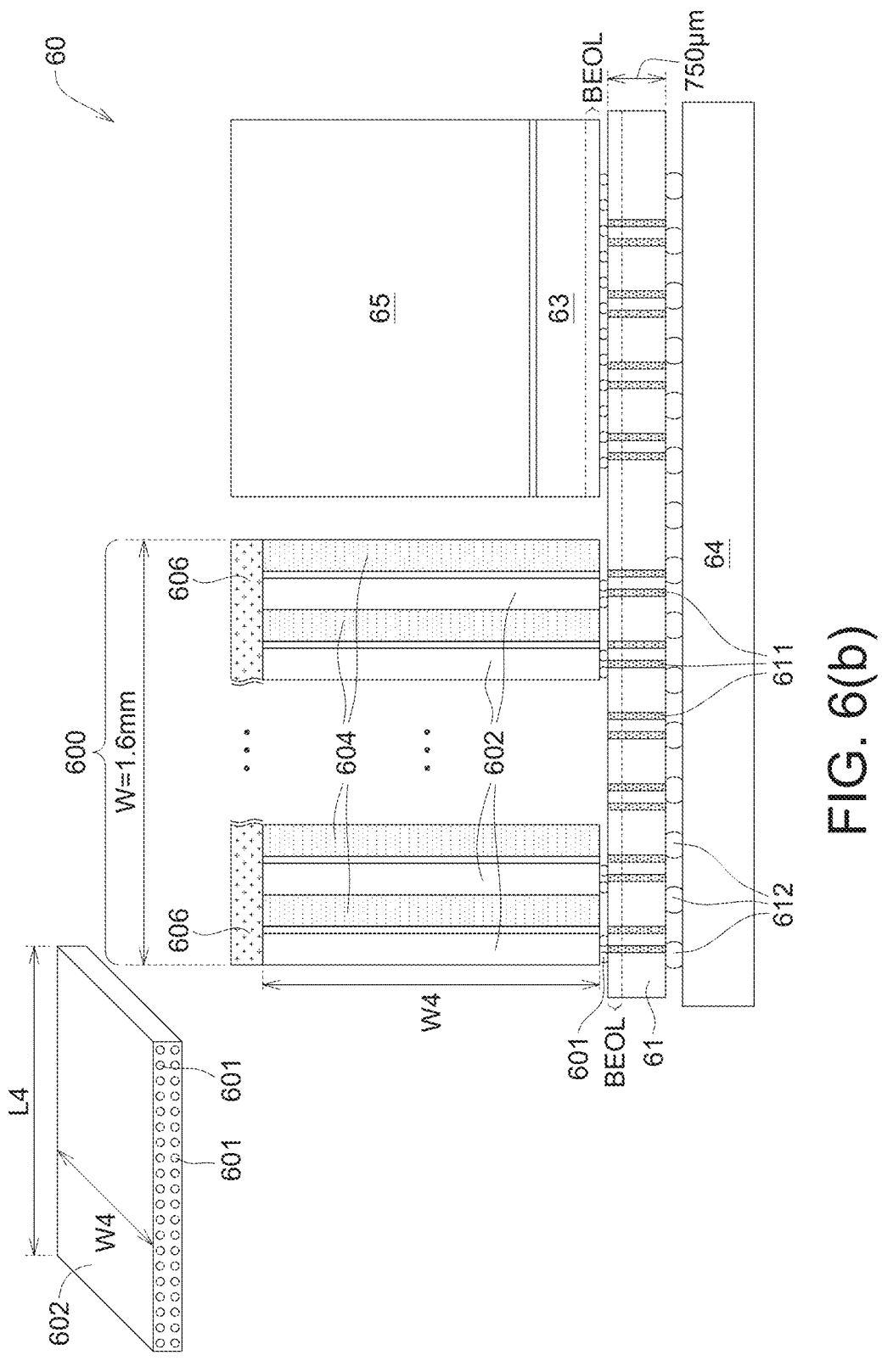
FIG. 6. 6(b)

3D IC STRUCTURE

PRIORITY CLAIM AND CROSS-REFERENCE

This application claims the benefit of U.S. provisional applications No. 63/825,508 filed Jun. 17, 2025, and is a continuation-in-part application of U.S. non-provisional application Ser. No. 19/059,275 filed Feb. 21, 2025, which claims the benefit of U.S. provisional application No. 63/716,506 filed Nov. 5, 2024, and is a continuation-in-part application of U.S. non-provisional application Ser. No. 18/471,670 filed Sep. 21, 2023 which claims the benefit of U.S. provisional applications No. 63/409,852 filed Sep. 26, 2022, the disclosures of all of which are incorporated by reference herein in their entirety.

FIELD

This disclosure relates in general to a memory stack within IC structure, and more particularly to a high bandwidth memory stack with side edge interconnections and 3D IC structure including the same.

BACKGROUND 2.5D/3D ICs have been recognized generation semiconductor technology, which has the advantage of high performance, low power consumption, small physical size and high integration density. 2.5D/3D ICs provide a path to continue to meet the performance/cost demands of next generation devices while remaining at more relaxed gate lengths with less process complexity. Thus, 2.5D/3D ICs are expected to find broad based utilities in applications such as HPC (high-performance computing) and data centers, AI (artificial intelligence)/ML (machine learning), 5G/6G networks, graphics, smart phones/wearables, automotive and others that demand "extreme," ultra-high-performance, higher-power-efficiency devices.

Commercial 2.5D/3D ICs such as a 3D high-bandwidth memory (HBM) DRAM memory die stack on logic are increasingly being used, and those HBM devices contain through silicon vias (TSVs) in both active dies and in the silicon interposer. Furthermore, 2.5D/3D ICs also allow for vertical stacking of heterogeneous dies from different manufacturing processes and nodes, chip reuse and chiplets-in-SiP (system-in-a-package) for high-performance applications, which have been already pushing the limits of a single die at the most advanced node. As shown in FIG. 1, a COWOS (chips-on-wafer-on-substrate) structure 20 includes an HBM structure 21 (with a plurality of DRAM memory dies 211 and a controller 212) with TSVs 201, a logic die 22 (such as a GPU or an SOC chip), a silicon interposer 23 with TSVs and a packaging substrate 24, wherein the HBM structure 21 and the logic die 22 are stacked on the silicon interposer 23, and the silicon interposer 23 is then stacked on the packaging substrate 24.

However, 2.5D/3D ICs adopt packaging topologies with bottom/top electrical interconnects created by the aforementioned interconnect technologies such as micro-bumps, TSVs and redistribution layers (RDL). The bottom/top electrical interconnects impose a severe constraint on PPAC (power, performance, area and cost) optimization by designers of 3D ICs to come up with optimal design solutions, especially the difficulty of forming TSVs in semiconductor dies and the alignment of TSVs for each semiconductor die.

Furthermore, as the monolithic integration capability of a silicon chip has grown from GSI (Giga Scale Integration:

Over billions of transistors on a die) toward TSI (Tera Scale Integration: Trillions of transistors on a die) soon, the power consumption of running such a huge number of transistors is increasing sharply, which elevates adversely the junction temperature of transistors and thus the entire chip temperature due to current limited heat-dissipation capability (e.g. Thermal conductivity index of silicon dioxide/silicon is very low. To be worse, due to the stack of multiple DRAM memory semiconductor dies (or HBM) in 2.5D/3D ICs, the insufficient heat dissipation problem causing higher temperature to chip operation is regarded as the worst problem for the HBM structure.

SUMMARY

According to a first aspect of the present disclosure, an IC structure includes a first memory stack. The first memory stack includes a plurality of semiconductor die. The plurality of semiconductor memory dies horizontally separate with each other, wherein each semiconductor die includes a top surface, a bottom surface opposite to the top surface, and four sidewalls with a first sidewall, a second sidewall, a third sidewall and a fourth sidewall, and a plurality of edge pads located on the first sidewall and arranged in multiple rows or two dimensions. An area of the bottom surface or the top surface is larger than that of any sidewall. A first part of the plurality of edge pads is located within a upper portion of the first sidewall of the semiconductor die, a second part of the plurality of edge pads is located within a lower portion of the first sidewall of the semiconductor die.

According to some embodiments of the present disclosure, the semiconductor die includes a memory die with a die substrate, a first RDL structure over a first surface of the die substrate, a second RDL structure over a second surface of the die substrate, and a plurality of signal pads located within a seal ring of the die substrate. A first part of the plurality of signal pads is electrically connected to the first part of the plurality of edge pads through the first RDL structure, and a second part of the plurality of signal pads is electrically connected to the second part of the plurality of edge pads through the second RDL structure and a set of TSVs within the die substrate. The first RDL structure is opposite to the second RDL structure.

According to some embodiments of the present disclosure, the first part of the plurality of edge pads are exposed from a sidewall of the first RDL structure, and the second part of the plurality of edge pads are exposed from a sidewall of the second RDL structure.

According to some embodiments of the present disclosure, the IC structure further includes an upward extending thermal conductivity layer. The upward extending thermal conductivity layer is disposed between two adjacent semiconductor dies, wherein the thermal conductivity of the upward extending thermal conductivity layer is higher than that of $SiO_2$.

According to some embodiments of the present disclosure, the IC structure further includes a laterally extending thermal conductivity layer. The laterally extending thermal conductivity layer covers each second sidewall of the plurality of semiconductor dies and thermally coupling to the upward extending thermal conductivity layer, wherein the laterally extending thermal conductivity layer is opposite to the first sidewalls of the plurality of semiconductor dies. The thermal conductivity of the laterally extends thermal conductivity layer is higher than that of $SiO_2$.

According to some embodiments of the present disclosure, the IC structure further includes a logic die with memory controller, a logic die with processor circuit and a packaging substrate. The logic die with memory controller is disposed under the first memory stack and electrically connected to the plurality of edge pads of each semiconductor die of the first memory stack. The logic die with processor circuit is disposed over and electrically connected to the logic die with memory controller. The packaging substrate is disposed under and electrically connected to the logic die with memory controller.

According to some embodiments of the present disclosure, the IC structure further includes a second memory stack. The second memory stack includes a plurality of semiconductor dies. The plurality of semiconductor dies horizontally separate with each other, wherein each semiconductor die includes a top surface, a bottom surface opposite to the top surface, and four sidewalls with a first sidewall, a second sidewall, a third sidewall and a fourth sidewall, and a plurality of edge pads located on the first sidewall and arranged in multiple rows or two dimensions. The plurality of edge pads of each semiconductor die of the second memory stack is electrically connected to the logic die with memory controller. The first memory stack and the second memory stack are horizontally spaced apart from the logic die with processor circuit, and are positioned over the logic die with memory controller. The first memory stack and the second memory stack are disposed along one side of the logic die with processor circuit, or are disposed along two side of the logic die with processor circuit respectively.

According to some embodiments of the present disclosure, the IC structure further includes a logic die with memory controller and processor circuit and a packaging substrate. The logic die with memory controller and processor circuit is disposed under the first memory stack and electrically connected to the plurality of edge pads of each semiconductor die of the first memory stack. The packaging substrate is disposed under and electrically connected to the logic die with memory controller and processor.

According to some embodiments of the present disclosure, the IC structure further includes a second memory stack. The second memory stack includes a plurality of semiconductor dies. The plurality of semiconductor dies horizontally separate with each other, wherein each semiconductor die includes a top surface, a bottom surface opposite to the top surface, and four sidewalls with a first sidewall, a second sidewall, a third sidewall and a fourth sidewall, and a plurality of edge pads located on the first sidewall and arranged in multiple rows or two dimensions. The plurality of edge pads of each semiconductor die of the second memory stack is electrically connected to the logic die with memory controller and processor circuit. The first memory stack and the second memory stack are horizontally spaced apart from each other, and are positioned over the logic die with memory controller and processor circuit.

According to some embodiments of the present disclosure, the first part of the plurality of edge pads is horizontally and/or vertically shifted from the second part of the plurality of edge pads.

According to a second aspect of the present disclosure, an IC structure includes a first memory stack. The first memory stack includes a plurality of semiconductor dies. The plurality of semiconductor dies horizontally separate with each other, wherein each semiconductor die includes a top surface, a bottom surface opposite to the top surface, and four sidewalls with a first sidewall, a second sidewall, a third sidewall and a fourth sidewall, and a plurality of edge pads located on the first sidewall and arranged in multiple rows or two dimensions. An area of the bottom surface or the top surface is larger than that of any sidewall. The plurality of edge pads is located within a central portion of the first sidewall of the semiconductor die.

According to some embodiments of the present disclosure, each semiconductor die is a composite die includes a memory die and a dummy die; wherein a first part of the plurality of edge pads is located on a sidewall of the memory die, and a second part of the plurality of edge pads is located on a sidewall of the dummy die.

According to some embodiments of the present disclosure, the memory die further includes a plurality of signal pads located within a seal ring, a first part of the plurality of signal pads are electrically connected to the first part of the plurality of edge pads through a first RDL structure of the memory die, and a second part of the plurality of signal pads are electrically connected to the second part of the plurality of edge pads through a second RDL structure of the dummy die and the first RDL structure of the memory die, wherein the first RDL structure is faced to the second RDL structure.

According to some embodiments of the present disclosure, the first part of the plurality of edge pads is exposed from a sidewall of the first RDL structure of the memory die, and the second part of the plurality of edge pads is exposed from a sidewall of the second RDL structure of the dummy die, wherein the central portion of the first sidewall of the semiconductor die includes the sidewall of the first RDL structure of the memory die and the sidewall of the second RDL structure of the dummy die.

According to some embodiments of the present disclosure, the dummy die is an upward extending thermal conductivity layer next to the memory die, and the thermal conductivity of the upward extending thermal conductivity layer is higher than that of $SiO_2$.

According to some embodiments of the present disclosure, the IC structure further includes a laterally extending thermal conductivity layer. The laterally extending thermal conductivity layer covers each second sidewall of the plurality of semiconductor dies and thermally coupling to the upward extending thermal conductivity layer, wherein the laterally extending thermal conductivity layer is opposite to the first sidewalls of the plurality of semiconductor dies. the thermal conductivity of the laterally extending thermal conductivity layer is higher than that of $SiO_2$.

According to some embodiments of the present disclosure, the IC structure further includes a logic die with memory controller, a logic die with processor circuit and a packaging substrate. The logic die with memory controller is disposed under the first memory stack and electrically connected to the plurality of edge pads of each semiconductor die of the first memory stack. The logic die with processor circuit is disposed over and electrically connected to the logic die with memory controller. The packaging substrate is disposed under and electrically connected to the logic die with memory controller.

According to some embodiments of the present disclosure, the IC structure further includes a second memory stack. The a second memory stack includes a plurality of semiconductor dies. The plurality of semiconductor dies horizontally separate with each other, wherein each semiconductor die includes a top surface, a bottom surface opposite to the top surface, and four sidewalls with a first sidewall, a second sidewall, a third sidewall and a fourth sidewall, and a plurality of edge pads located on the first sidewall and arranged in multiple rows or two dimensions; wherein the plurality of edge pads of each semiconductor die of the second memory stack is electrically connected to the logic die with memory controller. The first memory stack and the second memory stack are horizontally spaced apart from the logic die with processor circuit, and are positioned over the logic die with memory controller. The first memory stack and the second memory stack are disposed along one side of the logic die with processor circuit, or are disposed along two side of the logic die with processor circuit respectively.

According to some embodiments of the present disclosure, the IC structure further includes a logic die with memory controller and a packaging substrate. The logic die with memory controller and processor circuit is disposed under the first memory stack and electrically connected to the plurality of edge pads of each semiconductor die of the first memory stack. The packaging substrate is disposed under and electrically connected to the logic die with memory controller and processor.

According to some embodiments of the present disclosure, the IC structure further includes a second memory stack. The second memory stack includes a plurality of semiconductor dies. The plurality of semiconductor dies horizontally separate with each other, wherein each semiconductor die includes a top surface, a bottom surface opposite to the top surface, and four sidewalls with a first sidewall, a second sidewall, a third sidewall and a fourth sidewall, and a plurality of edge pads located on the first sidewall and arranged in multiple rows or two dimensions. The plurality of edge pads of each semiconductor die of the second memory stack is electrically connected to the logic die with memory controller and processor circuit. The first memory stack and the second memory stack are horizontally spaced apart from each other, and are positioned over the logic die with memory controller and processor circuit.

According to some embodiments of the present disclosure, there is no TSV in each semiconductor die.

BRIEF DESCRIPTION OF THE DRAWINGS

Aspects of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

FIGS. 3(a)_1 and 3(a)_2 show a perspective view and a cross-sectional view, respectively, of a composite die according to some embodiments of the present disclosure.

FIGS. 3(b)_1 and 3(b)_2 show a flow diagram of a manufacturing method of the composite die S1 in FIGS. 3(a)_1 and 3(a)_2.

FIGS. 4(a)_1 and 4(a)_2 show a perspective view and a cross-sectional view, respectively, of a high-bandwidth Low Latency memory (HBLM) die according to some embodiments of the present disclosure.

FIG. 4(c) shows a schematic diagram of another composite die according to an embodiment of the present disclosure.

FIG. 4(d) shows a schematic diagram of another composite die according to an embodiment of the present disclosure.

FIGS. 6(a) to 6(c) show an IC structure with L-HSM, according to some embodiments of the present disclosure.

DETAILED DESCRIPTION

Figure 1:
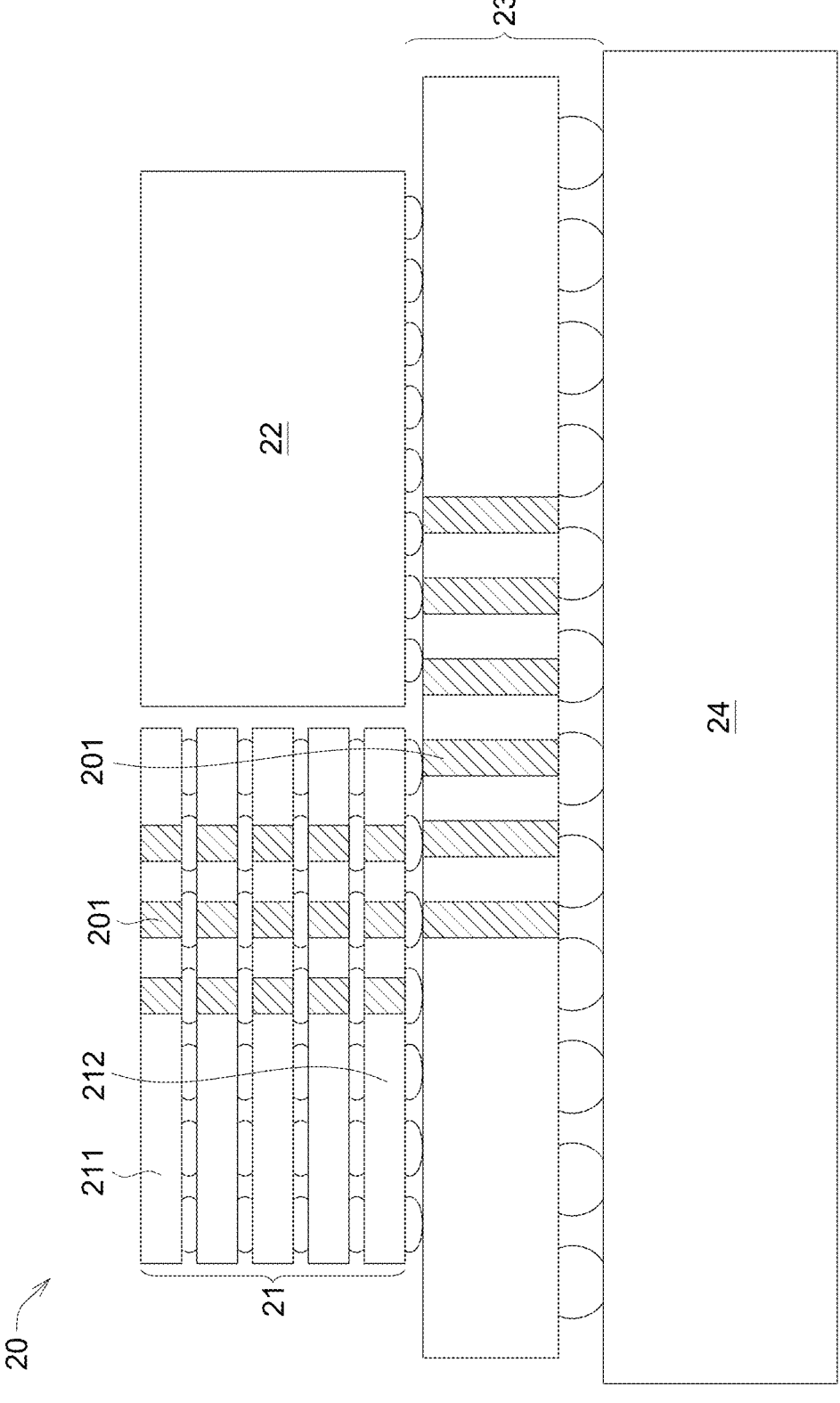
FIG. 1 shows a semiconductor COWOS structure, according to a comparative embodiment of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

In this invention, the side face(s) of memory dies are used for interconnecting dies in the 2.5D/3D IC stack to allow for skip-die signals and power distribution. Moreover, the high thermal conductivity material is disposed between two adjacent memory dies and thermally coupled to another high thermal conductivity material covering other side face of memory dies stack.

Figure 2A:
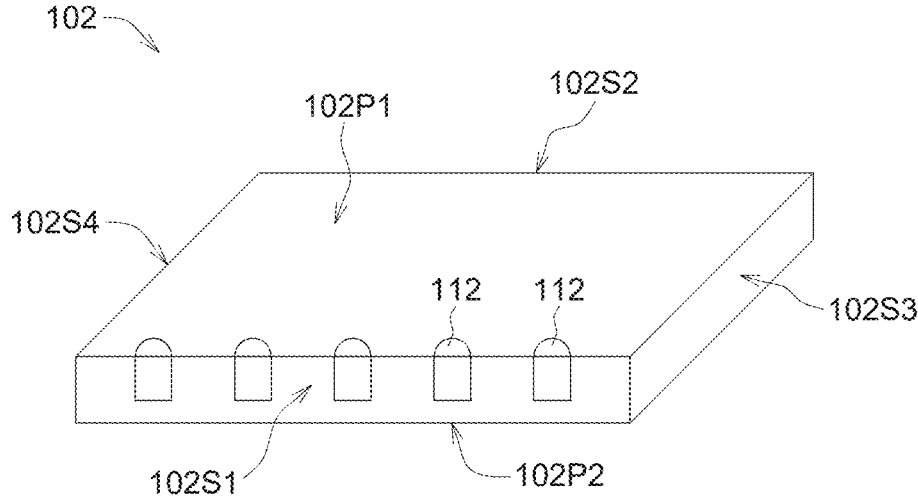
FIGS. 2(a) and 2(b) show a perspective view and a cross-sectional view, respectively, of a memory die with multiple edge pads, according to some embodiments of the present disclosure.

FIG. 2(a) show a perspective view and a cross-sectional view of an edge-pad semiconductor die (or semiconductor die hereinafter) 102 according to some embodiments of the present disclosure. The edge-pad semiconductor die 102 has a top surface 102P1, a bottom surface 102P2, and four sidewalls 102S1, 102S2, 102S3, and 102S4, wherein the area of the top surface/bottom surface 102P1/102P2 is far larger than those of the sidewalls 102S1, 102S2, 102S3, and 102S4 (as shown in FIG. 2(a)). The semiconductor die 102 further includes "edge pads" 112 in the form of peripheral pads residing at the periphery or side faces or sidewalls (such as sidewalls 102S1, 102S2, 102S3, and/or 102S4) of the edge-pad semiconductor die 102 in FIG. 2(a).

Further, in the event the semiconductor die 102 includes a memory die (such as DRAM die), the semiconductor die with edge pads located on the side surface could be named as High Bandwidth Low Latency Memory (HBLM) die or L-DRAM die. The combination of multiple HBLM dies or L-DRAM dies arranged in a stack or shelf could be named as HBLM Shelf or L-shape High Speed Memory (L-HSM). Hereinafter, the HBLM Shelf or L-HSM may be also referred to the memory stack or memory shelf.

Figure 2B:
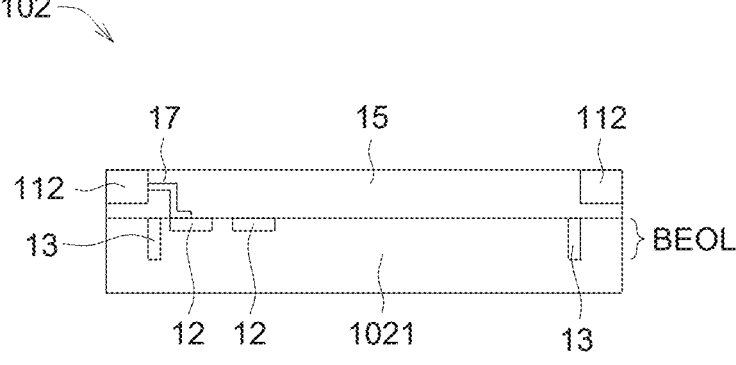

Referring to FIG. 2(b), in one embodiment, the edge-pad semiconductor die 102 includes a memory die 1021 and a redistribution layer (RDL) 15 over a top surface of the memory die 1021. The memory die 1021 can also be a DRAM die. In one embodiment, there is no through-silicon-vias (TSVs) in the memory die 1021 of the edge-pad semiconductor die 102 which includes edge pads along one the side surface. There are one or more signal pads 12 within the memory die 1021, and a seal ring 13 surrounding the signal pad 12. The memory die 1021 may include a BEOL (back end of line) region arranged on a front side of the memory die 1021. In one embodiment, each edge pad 112 of each semiconductor die 102 is electrically connected to the conductive line 17 in the redistribution layer 15 (RDL), and the conductive line 17 is electrically connected to the signal pad 12 in the back-end-of-line (BEOL) region of the semiconductor die 102. Referring to FIG. 2(b), in the substrate of the memory die 1021, all signal pads 12 are located within a region defined by the seal ring 13 within the substrate, and the edge pads 112 are located in the RDL 15 and electrically connected to the signal pads 12 (see of FIG. 2(b)) in the BEOL region.

In some embodiments, the interconnect structure of the RDL 15 may include a plurality of conductive line layers, a plurality of conductive vias, and one or more edge pads 112. The conductive lines, conductive vias and edge pads together construct the various conduction paths of the interconnect structure. FIG. 2(b) shows a conductive line 17 and vertical conductive vias arranged in the RDL 15 and electrically connecting the signal pad 12 to the edge pads 112.

Figure 2C:
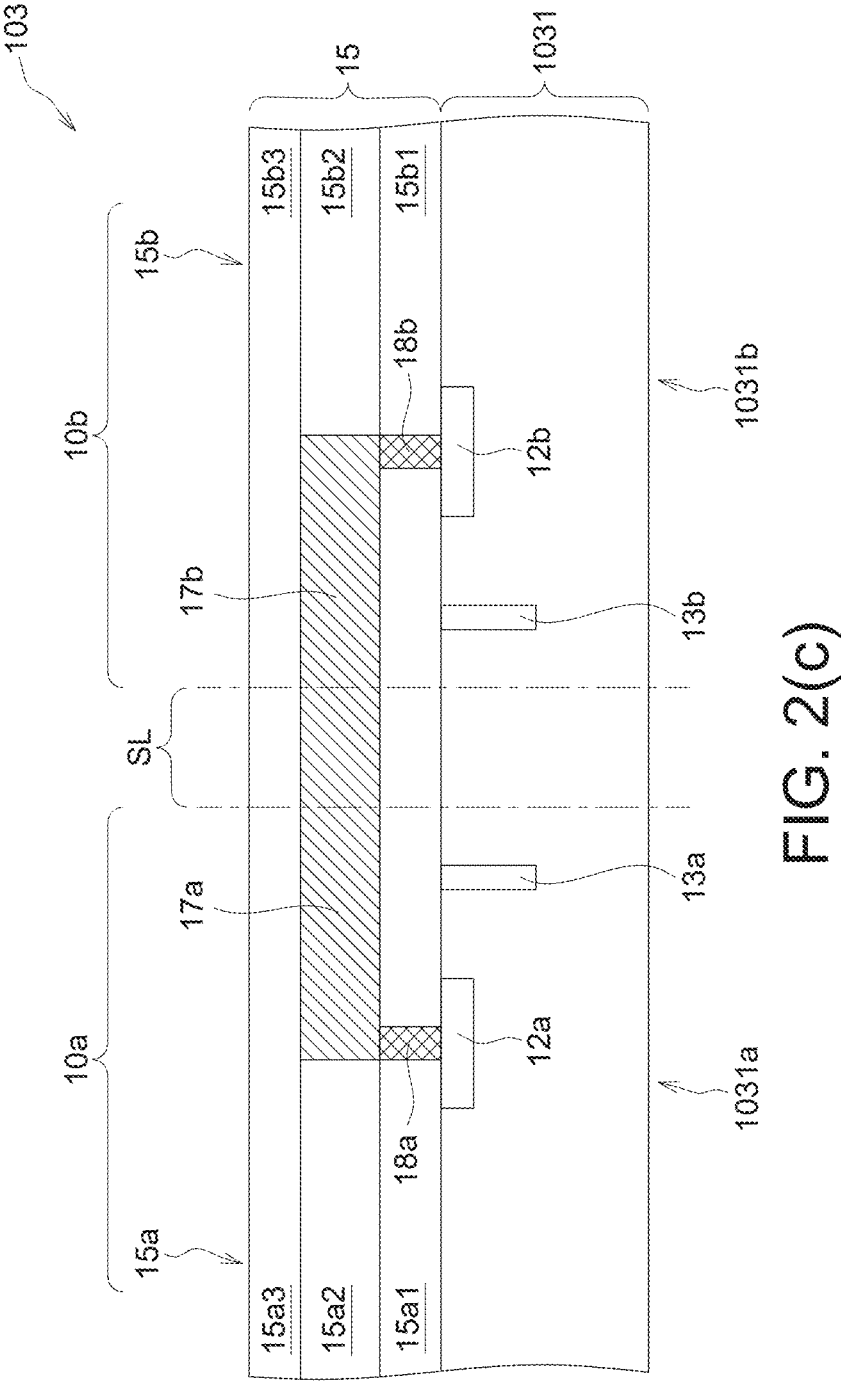
FIG. 2(c) shows a cross-sectional view of a semiconductor wafer containing memory dice with multiple edge pads, according to some embodiments of the present disclosure.

FIG. 2(c) shows a cross-sectional view of a portion semiconductor wafer 103 containing multiple edge-pad semiconductor dies according to some embodiments of the present disclosure. In some embodiments, as shown in FIG. 2(c), a plurality of edge-pad semiconductor dies, e.g., exemplary edge-pad semiconductor dies 10a and 10b, are formed on a semiconductor wafer 103. The boundaries of the adjacent edge-pad semiconductor dies 10a and 10b are defined by scribe line regions SL. In some embodiments, each edge-pad semiconductor die 10a or 10b includes a memory die 1031a or 1031b and an RDL 15a or 15b disposed over the respective memory die 1031a or 1031b. The memory die 1031a or 1031b further includes signal pads 12a or 12b, and seal rings 13a or 13b, in the memory dies 1031a and 1031b, respectively. Furthermore, the RDL 15a or 15b includes one or more conductive lines 17a or 17b or vias 18a or 18b, whichever appropriate for RDL design, electrically connected to the corresponding signal pads 12a or 12b, respectively. The RDL 15a (or 15b) further includes stacked dielectric or isolating layers 15a1, 15a2 and 15a3 (or 15b1, 15b2, or 15b3), within which the conductive line 17a or 17b is located. In some embodiments, the exposed portion of the conductive line or via 17a or 17b after wafer dicing performed in the scribe line region SL serves as the edge pad as previously described, such as shown in FIG. 2(b). The dielectric or isolating layers in one embodiment may be made of $SiO_2$.

Figure 2D:
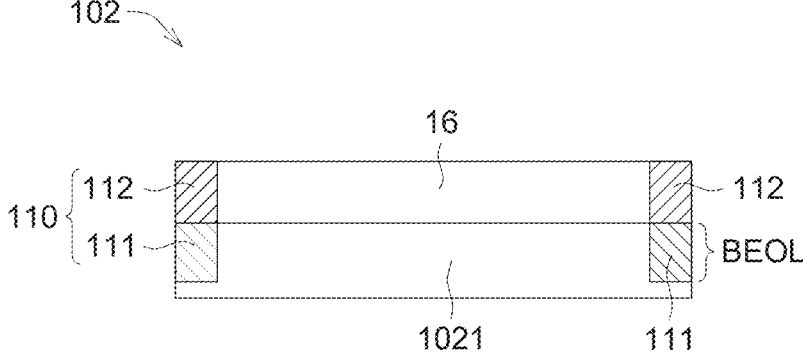
FIGS. 2(d) and 2(e) show cross-sectional views of another memory die with multiple edge pads, according to some embodiments of the present disclosure.
Figure 2E:
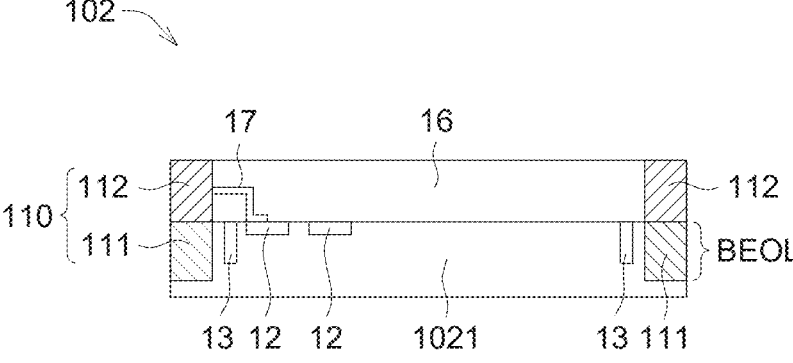

FIGS. 2(d) and 2(e) show cross-sectional views of the edge-pad semiconductor die or chip 102, according to some embodiments of the present disclosure. In some embodiments, the memory die 1021 of the edge-pad semiconductor die 102 has edge contacts 111 formed during the manufacturing process of the BEOL region, such as formed in a M4 or M5 metal layer. To increase the contact area of the edge pad, a dielectric layer 16 with one or more conductive via 112 or conductive lines is formed over the memory die 1021. Referring to FIG. 2(d), the conductive via 112 may correspond to or be aligned with the respective edge contacts 111. In some embodiments, the area (for example, the exposed lateral area) of the conductive via 112 is greater than that of the edge contact 111. In some embodiments, the edge contact 111 is electrically or physically connected to the corresponding conductive via 112. Thus, each edge pad 110 of the edge-pad semiconductor die 102 may include an edge contact 111 and a conductive via 112. In another embodiment, the dielectric layer 16 is replaced by the RDL 15, as shown in FIG. 2(e). Same numeral labels in FIG. 2(d) and FIG. 2(e) refer to substantially identical or functionally identical components and the associated description can be referred thereto without repeating here for brevity.

In the event larger edge pad pitch is required and the area of the sidewall 102S1 of the memory die shown in FIG. 2(a) is not enough to accommodate all edge pads, part of the signal or power pads of the memory die could be electrically connected with edge pads located on sidewalls of other dummy die which is attached to the memory die.

Referring to FIGS. 3(a)_1 and 3(a)_2, FIGS. 3(a)_1 and 3(a)_2 show a perspective view and a cross-sectional view, respectively, of a semiconductor die according to some embodiments of the present disclosure. The semiconductor die is a composite die S1 which includes a memory die (or main die) 1030 and a dummy die (or slave die) 202 separate with each other. The memory die 1030 includes the die substrate 1031 within which the memory array in located and the RDL 15 over a top surface of the die substrate 1031. In the present embodiment, there is no TSV in the memory die 1030 and the dummy die 202.

As illustrated in FIGS. 3(a)_1 and 3(a)_2, the composite die S1 includes a top surface 202P1, a bottom surface 202P2 opposite to the top surface 202P1, four sidewalls 202S1, 202S2, 202S3, 202S4 with the first sidewall 202S1, the second sidewall 202S2, the third sidewall 202S3 and the fourth sidewall 202S4. The area of the bottom surface 202P2 or the top surface 202P1 of the composite die S1 is larger than that of any of the sidewall 202S1, 202S2, 202S3 and 202S4.

As illustrated in FIGS. 3(a)_1 and 3(a)_2, the signal pads (such as the signal pad 121 and the signal pad 122) and the seal ring 13 are disposed within the memory die 1030. The edge pad 112, the conductive line 17, the conductive line 14 and the redistributed signal pad 19 are disposed in the RDL 15 of the memory die 1030. The seal ring 13 surrounds the signal pads of the memory die 1030. The memory die 1030 may include the BEOL (back end of line) region arranged on a front side of the die substrate 1031. Some of the signal pads (such as the signal pad 121) of the memory die 1030 is electrically connected with the edge pad 112 through the conductive line 17. The edge pad 112 is exposed from the first sidewall 202S1 for being connected with an electronic component (for example, a die, an interposer, a package, etc.) or additional edge RDL (not shown) over the first sidewall 202S1.

On the other hand, other edge pads (such as signal pad 122) of the memory die 1030 is electrically connected to the redistributed signal pad 19 through the conductive line 14, such that the redistributed signal pad 19 could be electrically connected with other edge pad (such as edge pad 2022) located within the dummy die 202. As illustrated in FIGS. 3(a)_1 and 3(a)_2, the dummy die 202 includes a die substrate 2021 and a RDL 25 over a top surface of the die substrate 2021. In an embodiment, there is no active circuit within the dummy die 202.

As illustrated in FIGS. 3(a)_1 and 3(a)_2, the edge pad 2022, the conductive line 24 and the connecting pad 29 are disposed in the RDL 25 of the dummy die 202. The connecting pad 29 is connected to the redistributed pad 19 for electrically connecting the signal pad 122 of the memory die 1030 with the edge pad 2022. Thus, the edge pad 2022 is electrically connected with the signal pad 122 of the memory die 1030 through the conductive line 24, the connecting pad 29, the redistributed pad 19 and the conductive line 24. The edge pad 2022 is exposed from the sidewall 202S1 for being connected with an electronic component (for example, a die, an interposer, a package, etc.) or additional edge RDL (not shown) over the first sidewall 202S1.

As compared with FIG. 2(a) and FIG. 2(b), in the composite die shown in FIG. 3(a)_1 and FIG. 3(a)_2, part of signal pads (such as signal pads 121) of the memory die 103 are electrically connected to the edge pads (such as edge pad 112) located within the RDL 15 of the memory die 103, and other signal pads (such as signal pad 122) of the memory die 103 are electrically connected to the edge pads (such as edge pad 2022) located within the RDL 25 of the dummy die 202.

Thus, a first part (for example, the edge pads 112) of the edge pads of the composite die S1 is located on an edge-wall of the memory die 1030, and a second part (for example, the edge pads 2022) of the edge pads is located on an edge-wall of the dummy die 202, wherein the first sidewall 202S1 of the composite die S1 includes the edge-wall of the memory die 1030 and the edge-wall of the semiconductor die 202. Therefore, the edge pads of the composite die S1 are arranged in multiple rows, for example, two rows or even more. The edge pads 112 and the edge pads 2022 are arranged in a two-dimensional form. In an embodiment, the edge pad 112 and the edge pad 2022 are staggered in X-axis and Z-axis. The edge pad 112 and the edge pad 2022 do not overlap in X-axis and Z-axis. In another embodiment, the edge pad 112 and the edge pad 2022 may at least partially overlap in Z-axis, and/or the edge pad 112 and the edge pad 2022 may at least partially overlap in X-axis.

Referring to FIGS. 3(b)_1 and 3(b)_2 which show a flow diagram of a manufacturing method of the composite die S1 in FIGS. 3(a)_1 and 3(a)_2. In step (1) of FIGS. 3(b)_1 and 3(b)_2, a first wafer W1 and a second wafer W2 are provided. The first wafer W1 includes at least one memory die 103 (not singulated yet) and a first oxide layer 1023, wherein the first oxide layer 1023 is disposed over the semiconductor die, and the redistributed pads 19 are exposed from a surface of the first oxide layer 1023. The second wafer W2 includes at least one dummy die 202 (not singulated yet) and a second oxide layer 2023, wherein the second oxide layer 2023 is disposed over the dummy die 202, and the connecting pads 29 are exposed from a surface of the second oxide layer 2023. In addition, in the first wafer W1, the memory die 1030 further includes at least one conductive via 102V (formed in, for example, the RDL 15 in FIG. 3(a)_2). Similarly, in the second wafer W2, the semiconductor die 202 further includes at least one conductive via 202V (formed in, for example, the RDL 25 in FIG. 3(a)_2) which electrically connects the edge pad 2022 with the connecting pad 29.

In step (2) of FIGS. 3(b)_1 and 3(b)_2, the first wafer W1 and the second wafer W2 are connected with each other. The first oxide layer 1023 and the signal pad 19 of the first wafer W1 may be connected with the second oxide layer 2023 and the signal pad 29 of the second wafer W2 by hybrid bonding.

In step (3) of FIGS. 3(b)_1 and 3(b)_2, during hybrid bonding, a pressure and a heat are applied to the he first wafer W1 and the second wafer W2, the first oxide layer 1023 of the first wafer W1 and the second oxide layer 2023 of the second wafer W2 are bonded and/or fused, and the redistributed pad 19 of the first wafer W1 and the connecting pad 29 of the second wafer W2 are bonded and/or fused. Afterward, the structure in step (3) of FIGS. 3(b)_1 and 3(b)_2 may be singulated for form at least one composite die S1 as illustrated in FIG. 3(a)_1 by using, for example, sawing, etc.

Figure 4B:
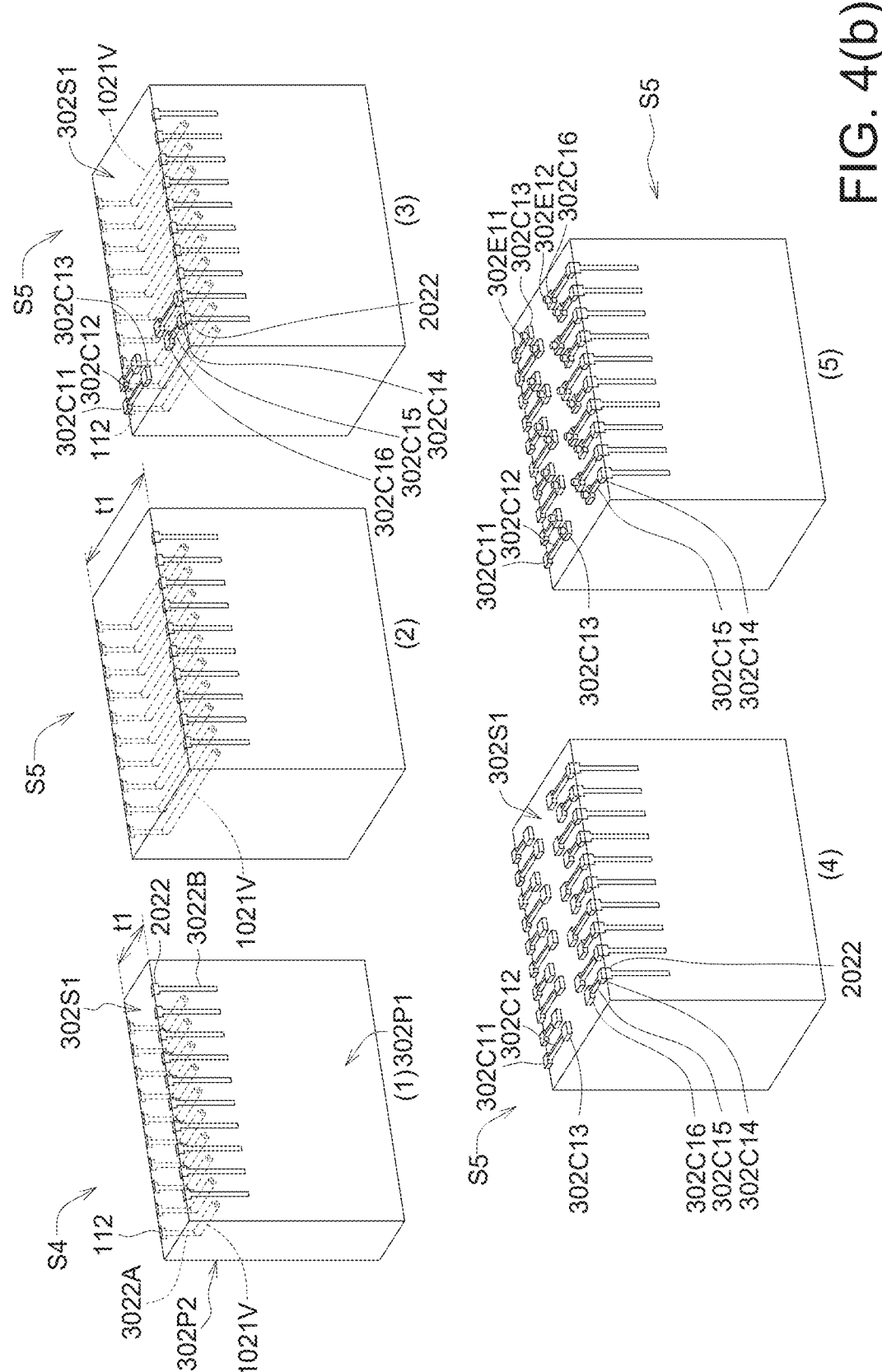
FIG. 4(b) shows a flow diagram of manufacturing method of a HBLM die according to embodiments.

It is possible that the edge pads could be arranged in multiple rows on the sidewall of the semiconductor die without the help of the dummy die. Referring to FIGS. 4(a)_1 and 4(a)_2, FIGS. 4(a)_1 and 4(a)_2 show a perspective view and a cross-sectional view, respectively, of a semiconductor die S3 according to some embodiments of the present disclosure. The semiconductor die S3 could be a memory die with a die substrate 10210, the bottom RDL 15 and the top RDL 25, wherein the bottom RDL 15 and the top RDL 25 are disposed on two opposite sides of the die substrate 10210 of the memory die. The semiconductor die S3 includes a top surface 302P1, a bottom surface 302P2 opposite to the top surface 302P1, four sidewalls 302S1, 302S2, 302S3, 302S4 with a first sidewall 302S1, a second sidewall 302S2, a third sidewall 302S3 and a fourth sidewall 302S4. The semiconductor die S3 also includes edge pads (such as edge pad 112 and edge pad 2022) located on the first sidewall 302S1.

The signal pads (such as signal pad 121 and signal pad 122) are surrounded by the seal ring 13 and within the BEOL region of the die substrate 10210 of the memory die. Some signal pads (such as signal pad 121) are electrically connected with the edge pads (such as edge pad 2022) located within the top RDL 25 through the conductive lines within the top RDL 25. Other signal pads (such as signal pad 122) are electrically connected with the edge pads located within the bottom RDL 15 through the conductive lines within the bottom RDL 15 and the conductive vias or through substrate vias (for example, the via 1021V) within the die substrate 10210 of the memory die.

As illustrated in FIGS. 4(a)_1 and 4(a)_2, the edge pad 112 and the conductive line 17 are disposed within the bottom RDL 15, on the other hand, the edge pad 2022 and the conductive line 24 are disposed within the top RDL 25. The signal pad 12, the seal ring 13 and the conductive via 1021V are disposed within the die substrate 10210 of the memory die. The edge pad 112 in the bottom RDL 15 is electrically connected with the signal pad 122 of the memory die through the conductive line 17 and the conductive via 1021V. The edge pad 2022 in the top RDL 25 is electrically connected with the signal pad 121 of the memory die through the conductive line 24. All edge pads of the semiconductor die S3 (such as the edge pads 112 and 2022) are exposed from the sidewall 302S1 for being connected with an electronic component (for example, a die, an interposer, a package, etc.) or the edge RDL (not shown) over the sidewall 302S1.

Thus, a first part of the signal pads of the semiconductor die S3 are electrically connected to the first part of the edge pads through a first or top RDL structure, and a second part of the signal pads of the semiconductor die S3 are electrically connected to the second part of the plurality of edge pads through a second or bottom RDL structure, wherein the first RDL structure is opposite to the second RDL structure. Since the semiconductor die S3 could be the memory die which includes the die substrate 10210, the bottom RDL 15 and the top RDL 25, therefore the first sidewall 302S1 of the semiconductor die S3 (or the memory die) also includes the sidewall of the die substrate 10210 of the memory die, the sidewall of the bottom RDL 15, and the sidewall of the top RDL 15. Thus, in other word, the first part of the edge pads of the composite die S3 are located on a first portion of the first sidewall 302S1 of the semiconductor die S3, and the second part of the edge pads of the semiconductor die S3 are located on a second portion of the first sidewall 302S1 of the semiconductor die S3, wherein the first portion of the first sidewall 302S1 is different from the second side of the first sidewall 302S1. For example, the edge pads 112 are located on a first portion of the first sidewall 202S1 (or the sidewall of the bottom RDL 15) of the semiconductor die S3, and the edge pads 2022 are located on the second portion of the first sidewall 202S1 (or the sidewall of the top RDL 25) of the semiconductor die S3, wherein the first portion of the first sidewall 202S1 is opposite to the second portion of the first sidewall 202S1.

As illustrated in FIGS. 4(*a*)_1 and 4(*a*)_2, in the semiconductor die S3, the edge pads 112 and the edge pads 2022 are arranged in multiple rows, for example, two rows or even more. The edge pads 112 and the edge pads 202 are arranged in a two-dimensional form. In an embodiment, the edge pad 112 and the edge pad 2022 are staggered in X-axis and Z-axis. The edge pad 112 and the edge pad 2022 do not overlap in X-axis and Z-axis. In another embodiment, the edge pad 112 and the edge pad 2022 may overlap in Z-axis, and/or the edge pad 112 and the edge pad 2022 may overlap in X-axis.

The following describes the edge RDL over the sidewall of the semiconductor die from which the edge pads are exposed. For example, the semiconductor die S4 in FIG. 4(*b*)(1) includes the features the same as or similar to that of the semiconductor die S3, and the semiconductor die S4 further includes at least one conductive lines 3022A and 3022B, wherein the conductive lines 3022A are disposed on the bottom surface 302P2 and connected with some edge pads 112, and the conductive lines 3022B are disposed on the top surface 302P1 and connected with other edge pads 2022. Those edge pads of the semiconductor die S4 are exposed from the sidewall 302S1. The conductive vias 1021V are connected with the conductive lines 3022A.

Moreover, another semiconductor die S5 in FIG. 4(*b*)(2) includes the features the same as or similar to that of the semiconductor die S4, and at least one difference is that the semiconductor die S5 has a thickness t1 greater than a thickness t1 of the semiconductor die S4, such that the edge RDL is easily formed on the sidewall 302S1 of the semiconductor die S5.

FIG. 4(*b*)(3) illustrates portion of the edge RDL which includes edge connecting pad 302C11 and 302C14, edge conductive line 302C12 and 302C15, bonding pad 302C13 and 302C16. The edge connecting pad 302C11 is connected with the edge pad 112, the edge conductive line 302C12 connects the edge connecting pad 302C11 with the bonding pad 302C13. Similarly, the edge connecting pad 302C14 is connected with the edge pad 2022, the edge conductive line 302C15 connects the edge connecting pad 302C14 with the bonding pad 302C16. FIG. 4(*b*)(4) illustrates the edge RDL completely formed over the sidewall 302S1 of the semiconductor die S5, and FIG. 4(*b*)(5) further illustrates that the contacts (such as contacts 302E11 and 302E12) are over the bonding pads (such as bonding pads 302C13 and 302C16). In an embodiment, the contact 302E11 and the contact 302E12 are, for example, solder, pillar, bump, etc.

Referring to FIG. 4(*c*), FIG. 4(*c*) shows a schematic diagram of a composite die S7 according to an embodiment of the present disclosure. The composite die S7 includes a semiconductor die S7A similar to the semiconductor die S3 illustrated in FIG. 4(*a*) and a dummy die S7B similar to the dummy die 202 illustrated in FIG. 3(*a*). The major difference between the composite die S7 in FIG. 4(*c*) and the composite die S1 in FIG. 3(*a*) is that, the edge pads of the composite die S7 in FIG. 4(*c*) are distributed along three rows. Some signal pads (such as signal pad 123) of the semiconductor die S7A are electrically connected with the edge pads (such as edge pads 5022) located on the sidewall 502S1 of the dummy die S7B. The other detail of the semiconductor die S7A is skipped for simplicity.

As illustrated in FIG. 4(*c*), the dummy die S7B includes a die substrate 5021 and a RDL 35, wherein the RDL 35 is disposed on a surface of the die substrate 5021. The dummy die S7B further includes conductive lines 5023 and bonding pads 5024. The edge pad 5022, the conductive line 5023 and the bonding pad 5024 are disposed in the RDL 35. The edge pad 5022 is exposed from the sidewall 502S1 of the dummy die S7B. The edge pad 5022 of the dummy die S7B is electrically connected with the signal pad 123 of the semiconductor die S7A at least through the conductive line 5023 and the bonding pad 5024. Furthermore, the bonding pad 5024 of the dummy die S7B is connected with the redistributed pad 4023 of the semiconductor die S7A, and the redistributed pad 4023 is electrically connected with the signal pad 123 through the conductive line 24.

Moreover, in another embodiment as shown in FIG. 4(*d*) which is similar to FIG. 4(*c*), the dummy die S7B could include a die substrate 5021, a bottom RDL 35, a top RDL 45, and through die vias (such as the via 5021V), such that some signal pads (such as signal pad 124) of the semiconductor die S7A could be electrically connected with the edge pads (such as edge pad 7022) in the top RDL 45 at least through the conductive line 7023 and the connecting pad 7024 in the top RDL 45. The other details of FIG. 4(*d*) are skipped for simplicity. Therefore, the composite die S9 in FIG. 4(*d*) has edge pads exposed from the sidewall 302S1 of the semiconductor die S7A and the sidewall 502S1 of the dummy die S7B, and those edge pads are distributed along four rows.

Figures 5A, 5B:
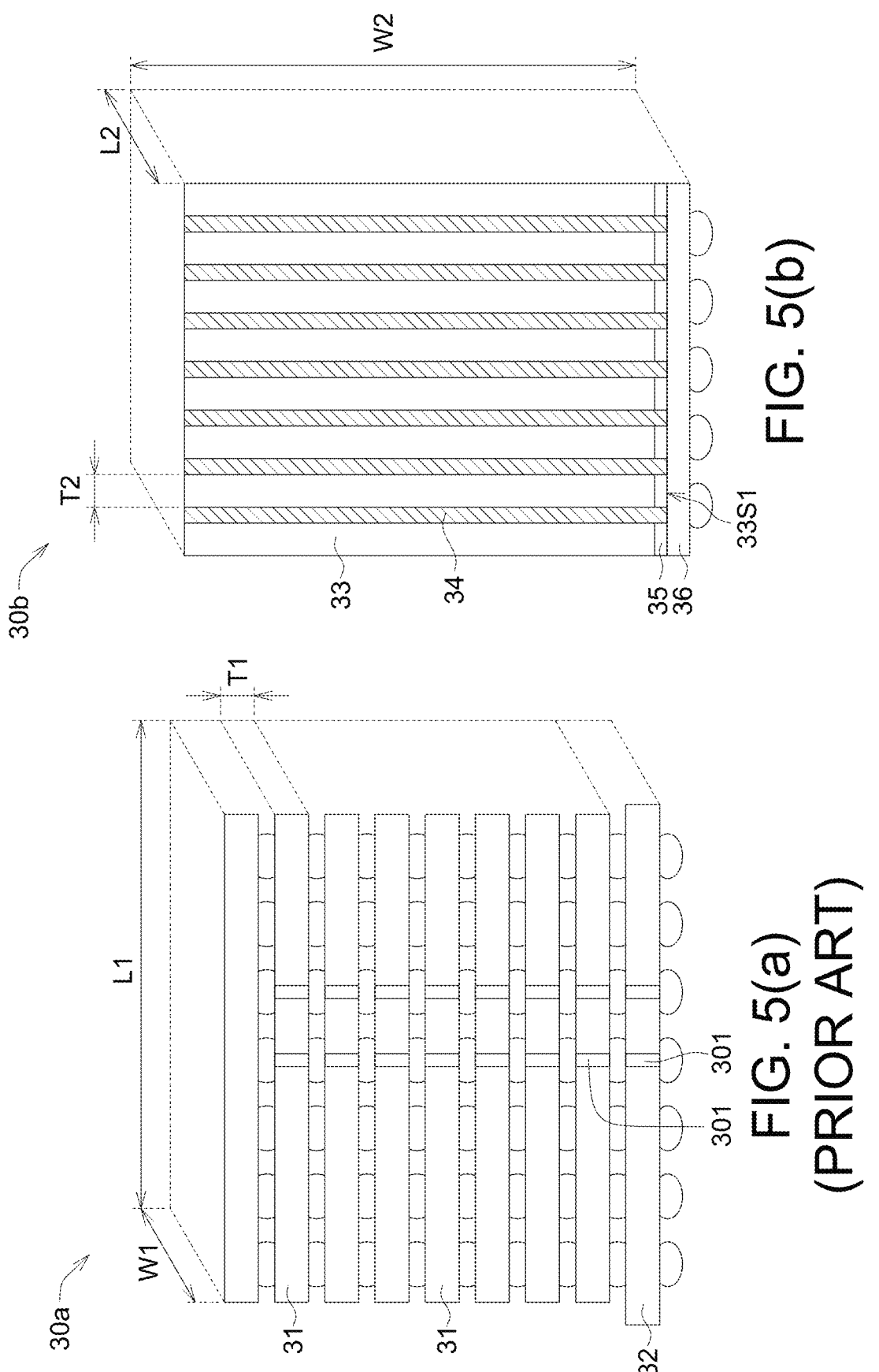
FIG. 5(a) shows a perspective view of a conventional high-bandwidth memory (HBM) structure.
FIG. 5(b) shows a perspective view of a HBLM shelf or L-shape High Speed Memory (L-HSM) system, according to some embodiments of the present disclosure.

Multiple semiconductor dies shown in FIG. 4(a) or multiple composite dies (either shown in FIG. 3(a), FIG. 4(c), or FIG. 4(d)) could be combined together to form the HBLM Shelf or L-HSM system to replace the conventional high-bandwidth memory (HBM) structure. FIG. 5(a) shows a perspective view of a conventional HBM structure 30a, which includes a plurality of DRAM chips 31 (such as 12 chips for HBM3 or 16 chips for HBM4) vertically stacked together above a controller 32, wherein each DRAM chip 31 has a width W1 about 9.5 mm, a length L1 about 10.5 mm, and a thinner thickness T1 about 0.05 mm due to the requirement of multiple TSVs 301 therein. Usually, four DRAM chips 31 are grouped together to output 1K bits of data bus width, wherein each DRAM chip 31 outputs 256 bits. Thus, when 12 DRAM chips in the HBM3 configuration are divided into three group, each group with 4 DRAM chips can output 1K bits of data, respectively.

FIG. 5(b) shows a perspective view of a HBLM shelf or L-HSM system 30b, according to some embodiments of the present disclosure. In contrast to the conventional HBM structure 30a, the HBLM shelf 30b of the present invention includes a plurality of edge-pad semiconductor dies 33, a plurality of high thermal conductivity layer 34 (optionally), and a memory controller 36 (optionally). In some embodiments, the plurality of edge-pad semiconductor dies 33 are horizontally separate or horizontally stacked together, such as 4, 8, 16 or 24 chips or more. In some embodiments, each edge-pad semiconductor die 33 has a width W2 ranging between about 4 mm~9 mm, a length L2 ranging between about 5 mm and about 15 mm (like the one used in the HBM stack structure 30a), and a regular thickness T2 ranging between about 100 micrometers~500 micrometers. Moreover, for heat dissipation purposes, the high thermal conductivity "HTC" layer 34 (such as SiC/AlN/BN/W/Cu/ undoped polysilicon/large crystalline silicon . . . ) is disposed adjacent to one edge-pad semiconductor chip 33 respectively, or disposed between two disposed edge-pad semiconductor chips 33. Furthermore, although not separately shown in FIG. 5(b), one or more HTC material or layers, e.g., the feature 606 shown in FIG. 6(a), could be used to cover the top of the edge-pad semiconductor dies or chips 33 and couple to the other HTC layer 34 between the edge-pad semiconductor dies 33. The edge-pad semiconductor die 33 could be the semiconductor die S3 in FIG. 4(a), or the combination of one edge-pad semiconductor chip 33 and the high thermal conductivity layer 34 could be the composite die in FIG. 3(a), FIG. 4(c) or FIG. 4(d), wherein the high thermal conductivity layer 34 could be the dummy die described in FIG. 3(a), FIG. 4(c) or FIG. 4(d).

The HBLM shelf 30b may further include a plurality of edge pads 35 arranged on a lower sidewall 33S1 in the direction of the length L2. Using the composite die in FIG. 3(a) as example, when a bonding pitch of about 50 μm is used, each edge-pad semiconductor die 33 has 300 edge pads 35 (15 mm/50 μm=300) in the direction of the length L2, and the high thermal conductivity layer 34 (the dummy die) has 300 edge pads 35 (15 mm/50 μm=300) in the direction of the length L2 as well. Therefore, suppose one half of the edge pads 35 are used for data I/O, each composite die could have 300-bit output data (assuming a bonding pitch of about 30 μm), or other numbers of the edge pads 35 depending on the different bonding pitches. Of course, if the composite die in FIG. 4(c) or FIG. 4(d) is used, there could be 900 edge pads or 1200 edge pads.

On the other hand, if the semiconductor die S3 in FIG. 4(a) is used as an example, there are 300 edge I/O pads (15 mm/50 μm=300) located along a portion of the sidewall 302S3 of the semiconductor die S3, and there are additional 300 edge I/O pads located along another portion of the sidewall 302S3 of the semiconductor die S3. Therefore, there are total 600 I/O pads arranged in a two dimensional array and located on the sidewall 302S3 of the semiconductor die S3, and there could be 300 data I/Os within the 600 I/O pads.

When four semiconductor dies S3 in FIG. 4(a) or four composite dies in FIG. 3(a) are combined together, there are around 1K data I/Os which is compatible with HBM3 specification; when eight semiconductor dies or composite dies are combined together, there are 2K data I/Os which is compatible with HBM4 specification. Of course, there could be 12, 16, 20, 24 or more semiconductor dies or composite dies combined together to offer wider data I/Os, such as 3K~6K data I/Os.

Of course, embodiments of the present invention could be used in different die sizes of the edge-pad semiconductor die 602 and different bonding pitches for the edge pads 601. If necessary, an edge RDL (see U.S. application Ser. No. 18/471,670, and U.S. application Ser. No. 19/059,275, all content of which is incorporated by reference herein) could be optionally used for the formation of edge pads. The plurality of edge-pad semiconductor dies 33 (i.e., HBLM shelf) are electrically coupled to the memory controller 36 through the edge pads 35, such that the memory controller 36 can output the data with a desired data width based on the number of output data of one edge-pad semiconductor die 33, the combined output data of two or more edge-pad semiconductor dies 33, or the combined output data of all edge-pad semiconductor dies 33.

Figure 6A:
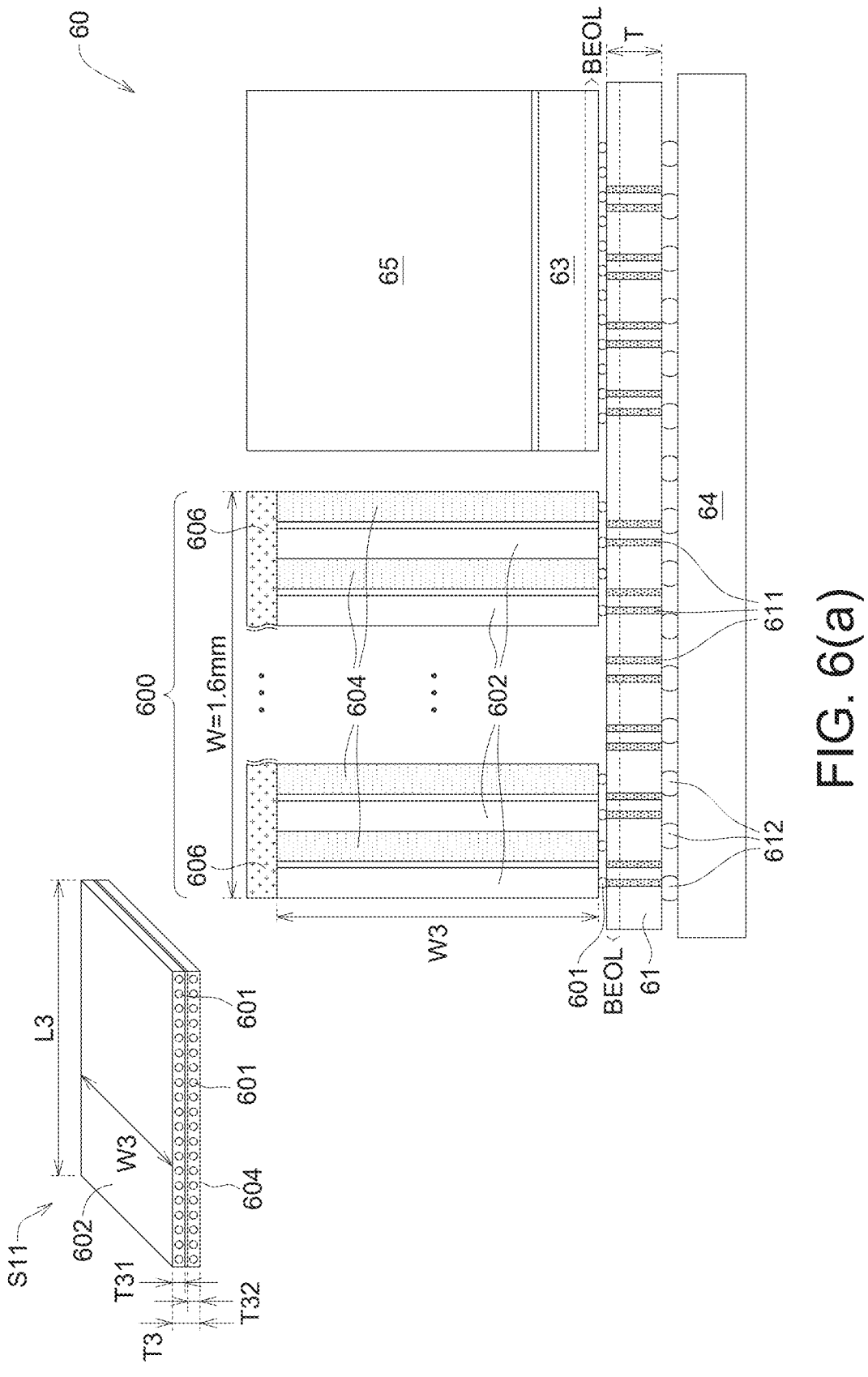
Figure 6C:
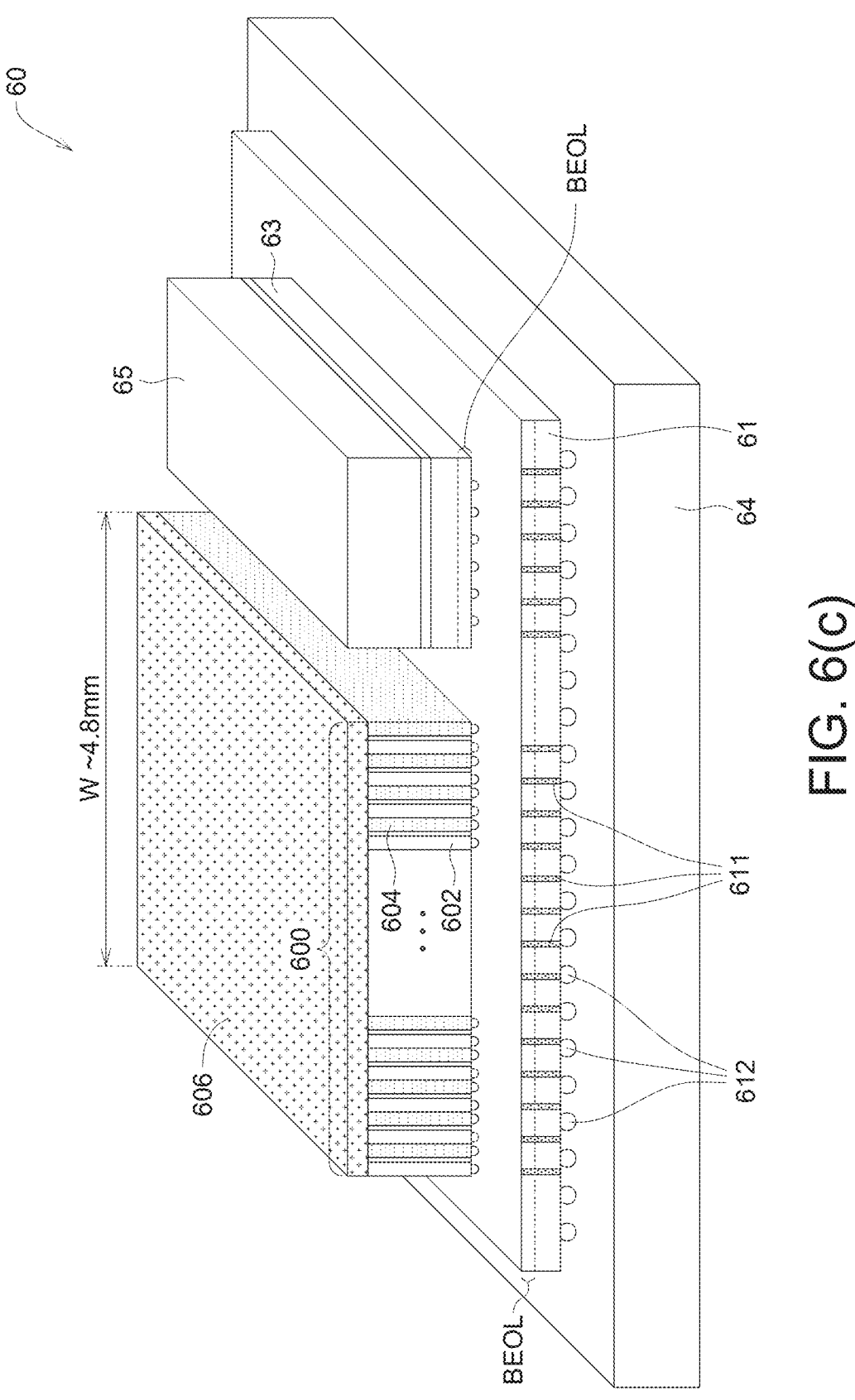

The present invention further utilizes the HBLM shelf or L-HSM system for 3D IC without using wafer or interposer in the COWOS structure 20 shown in FIG. 1. FIGS. 6(a) to 6(c) show a 3D IC structure 60 according to some embodiments of the present disclosure. FIG. 6(c) is the stereoscopic view of FIG. 6(a) or FIG. 6(b). As shown in a right plot of FIG. 6(a), the 3D IC structure 60 includes (1) a package substrate 64, (2) a memory controller 61 (also referred to as "logic die with memory controller" throughout the present disclosure), (3) an HBLM shelf 600, (4) an SOC (System-on-a-Chip) chip 63 (also referred to as "logic die with processor circuit" throughout the present disclosure) and (5) optionally a heat sink 65. The HBLM shelf or L-HSM system 600 includes a plurality of composite dies S11 and optionally a top-high thermal conductivity layer 606 (also referred to as "laterally extending high thermal conductivity layer" or "laterally extending thermal conductivity layer" throughout the present disclosure). Each composite dies S11 includes an edge-pad semiconductor die (also referred to as "memory die" or "main die") 602 and a high thermal conductivity layer (also referred to as "dummy die" or "slave die") 604. There may be another adhesive layer between the edge-pad semiconductor die 602 and the dummy die 604. In an embodiment, the number of the composite dies S11 of the HBLM shelf 600 may be equal to 8, even more or even less. The high thermal conductivity layer could be an upward extending thermal conductivity layer with the structure of the dummy die shown in FIG. 3(a).

In an embodiment, a die area of the memory controller 61 is larger than the sum of a horizontal cross-section area of the stack 600 and a die area of the SOC chip 63. The high thermal conductivity layer may be made of a material including, for example, AlN, BN, W, SiC, Copper, etc. In an embodiment, the thermal conductivity of the upward extending thermal conductivity layer and the laterally extending thermal conductivity layer is higher than that of $SiO_2$.

The HBLM shelf 600 and the SOC chip 63 are electrically bonded to the memory controller 61. The memory controller 61 is bonded to the package substrate 64. Thus, there is no silicon interposer between the HBLM shelf 600 (or the memory controller 61) and the package substrate 64. The heat sink 64 may be disposed over the SOC chip 63 and have a top surface substantially level with a top surface of the HBLM shelf 600.

In some embodiments, the package substrate 64 is a PCB (printed circuit board) substrate. The package substrate 64 may be a laminated substrate formed of multiple layers of copper foils with electrically insulating laminated materials, in which the laminated materials include fiberglass-rein-forced epoxy resins, also known as FR-4, Teflon, polyimide, ceramic, or other suitable materials.

Any commercially available DRAM die, such as DDR4 die, DDR5 die, LDDR4 die, LDDR5 die, or GDDR7 die, etc. could be used as the edge-pad semiconductor die 602. For example, as shown in a left plot of FIG. 6(*a*), each edge-pad semiconductor die 602 in an example has a die size of about 4~6 mm (for a width W3), 10 mm (for a length L3), and 100 μm (for a thickness T31), and each dummy die 604 in an example has a die size of about 4~6 mm (for the width W3), 10 mm (for the length L3), and 100 μm (for a thickness T32). Each composite die S11 may include edge pads 601 arranged along a sidewall in the lengthwise direction of the composite die S11.

FIG. 6(*b*) shows another embodiment of the present invention, and the difference between FIG. 6(*b*) and FIG. 6(*a*) is that, the semiconductor die S3 described in FIG. 4(*a*) is utilized as the edge-pad semiconductor die 602, and each semiconductor die 602 includes two rows of 600 edge pads arranged along the sidewall of the semiconductor die 602, wherein one row of 300 edge pads are located one portion of the sidewall of the semiconductor die 602, and another row of 300 edge pads are located on another portion of the sidewall of the semiconductor die 602. No edge pad is located on the sidewall of the high thermal conductivity layer 604. The power/control/data signals of each semiconductor die 602 could be propagated to the memory controller logic die without through other HBLM dies. Moreover, since there is inter-high thermal conductivity (HTC) layer (such as SiC, Si, AlN, BN, W, Copper, etc.) between two adjacent semiconductor die 602 dies and connected to a top HTC layer on other sidewall(s) of the HBLM Shelf, the heat generated from those two semiconductor dies 602 could be spread through the inter-high thermal conductivity layer to the top-high thermal conductivity layer, and passed to other heat sink (not shown) connected to the top-high thermal conductivity layer.

It should be noted that FIG. 6(*a*), FIG. 6(*b*), and FIG. 6(*c*) of this embodiment are just sketched and exemplary draw-ings, and the components in those drawings may not be proportional to their real sizes.

As shown in FIG. 6(*c*), in the event each composite die S11 has a length of 33 mm and a width of 26 mm (that is, the die area is equal one reticle size by 26 mm×33 mm), to accommodate the L-HSM system 600 with such composite dies S11, the die area of the memory controller 61 could be 26 mm (width)*66 mm (length), which is around 2 reticle sizes. However, since the width (W) of the L-HSM system 600 with 8 edge-pad semiconductor dies 602 and 8 dummy dies 604 is just around 1.6 mm (the thickness of each edge-pad semiconductor die 602 and each dummy die 604 is around 100 μm), the rest of the die area of the memory controller 61 could still accommodate another SOC chip 63, such as CPU, GPU, etc. The area of the memory controller 61 is dependent on the size and number of the L-HSM system 600 and the SOC chip 63. Furthermore, it is possible that there are two or more L-HSM system 600 over the memory controller 61.

Both of the SOC die 63 and the composite dies S11 are designed to be disposed over the surface of the memory controller 61. Their IOs are well connected by monolithic interconnections. The outgoing pads of the SOC die 63 are made in the electrical connection to the package substrate 64 through the memory controller 61. On the memory control-ler 61, the controller circuits are designed at the front surface, shown by a dash line with a label "BEOL" (back end of line), well connected to the IOs of the SOC die 63 designed at the bottom surface (shown by a dash line with a label "BEOL"). In this memory controller 61, TSVs 611 are made across the die thickness, and micro bumps or hybrid bumps 612 are electrically connected to the TSVs 611. The IOs of the SOC die 63 could be electrically connected to the IOs edge pads of composite dies S11 through the memory controller 61. Then the memory con-troller 61 is electrically connected to the package substrate 64 with properly designed alignment. In some embodiments, the thickness (T) of the memory controller 61 is about 750 μm.

Although in this example the memory controller 61 is facing upward (shown by a dash line with the label "BEOL" in FIG. 6(*a*)), in another example the memory controller 61 could be facing downward or flipped and connected to the package substrate 64. Since there are TSVs 611 in the memory controller 61, the composite dies S11 (or semicon-ductor dies 602 and/or 604) could be electrically connected to the memory controller 61 through the TSVs 611 therein or RDLs (not shown) over the memory controller 61.

These IOs output high-bandwidth data, and the memory controller 61 can be designed to select an appropriate number of IOs (such as, a portion of data IOs of one composite die S11, all data IOs of one composite die S11, portion of data IOs of multiple composite dies S11, or all data IOs of multiple composite dies S11) either by a cross-bar circuit design. In another embodiment, SRAM array is used to conduct the data IOs of the HBLM shelf 600 from part or all composite dies S11. For example, a plurality of SRAM arrays are respectively corresponding to the plurality of composite dies S11, and each SRAM array temporarily holds the selected appropriate number of IOs from the corresponding composite dies S11. In some embodiments, the plurality of edge pads 601 of each composite die S11 includes a subset of data pads, and the memory controller 61 selects a predetermined data bits from the data pads 601 of one composite die S11, a portion of the plurality of com-posite dies S11, or all the plurality of composite dies S11. The selected appropriate number of IOs of each composite die S11 could be set by a mode register in each composite die S11.

As previously mentioned, the memory controller 61 of the present invention includes multiple TSVs 611, such that the power/control/data signals of each composite die S11 and/or the SOC die 63 could be received or transmitted through the memory controller 61 to the package substrate 64, as shown in FIG. 6(*a*). Additionally, the heat sink 65 is disposed over the SOC die 63, such that the top surface of the combination of the heat sink 65 and the SOC die 63 could be leveled with the top surface of the HBLM shelf 600.

Figure 7A:
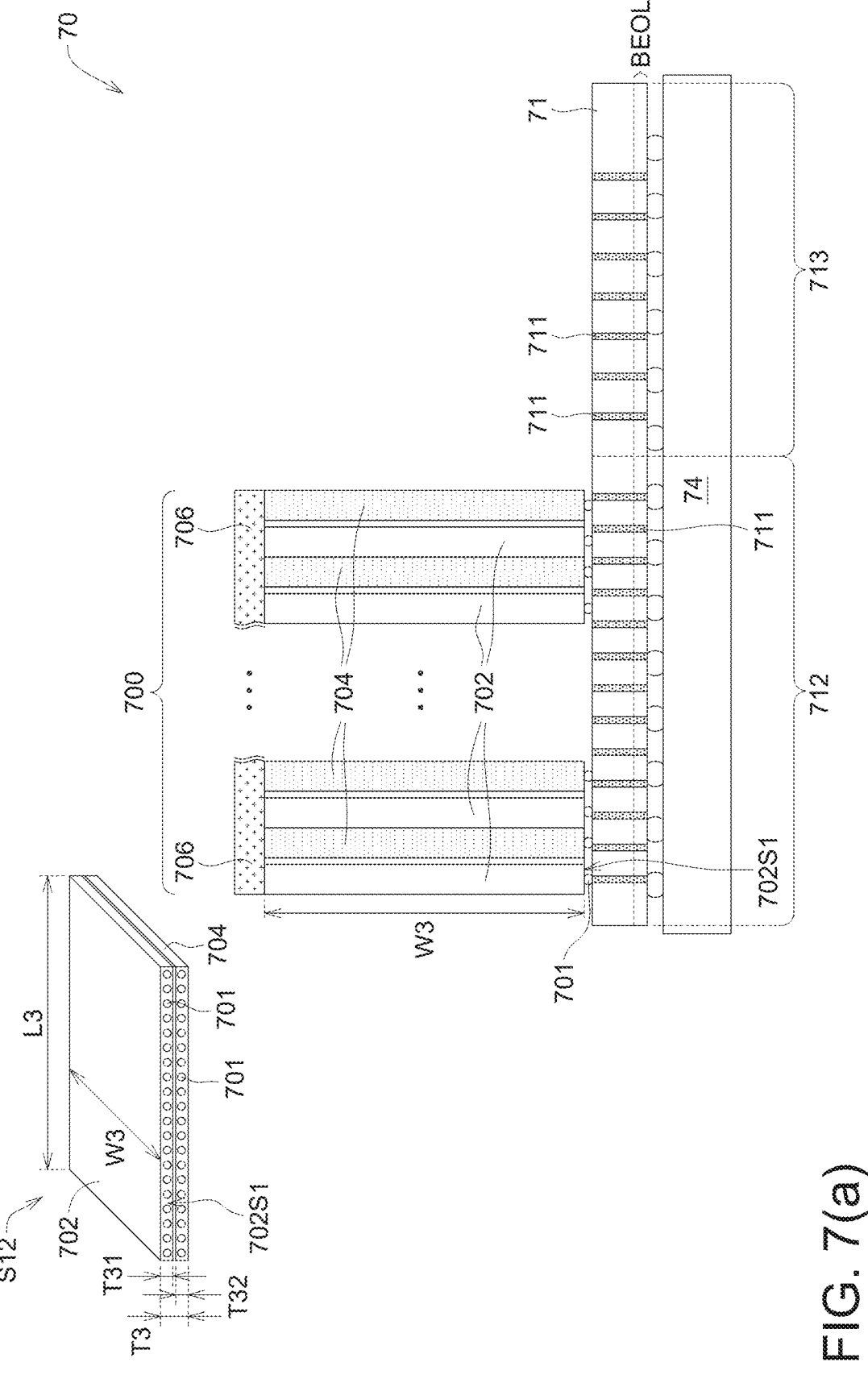
FIGS. 7(a) and 7(b) show another IC structure with L-HSM, according to some embodiments of the present disclosure.
Figure 7B:
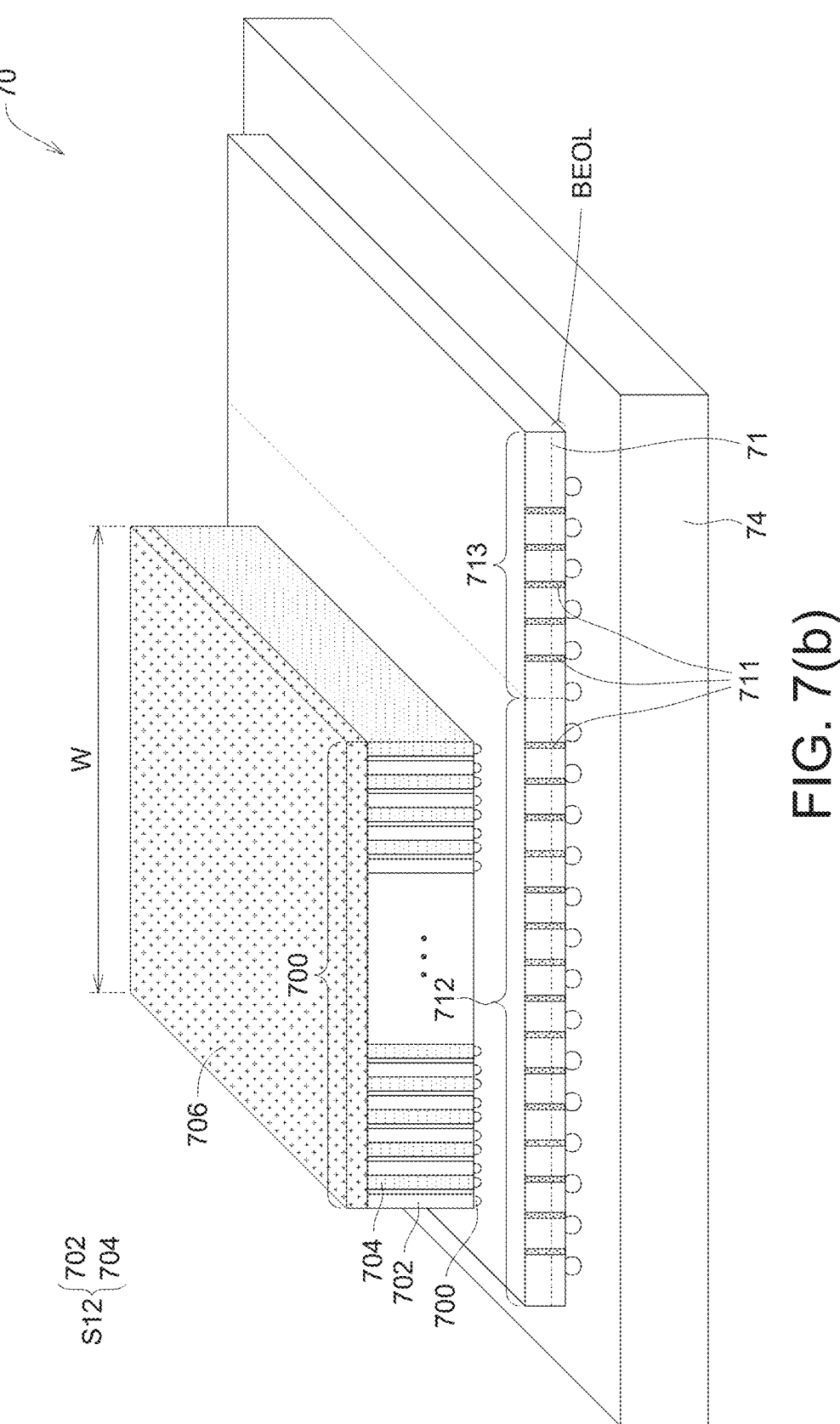

FIG. 7(*a*) shows another 3D IC structure 70 according to some embodiments of the present disclosure, and FIG. 7(*b*)

is the stereoscopic view of the 3D IC structure 70. As shown in a right plot of FIG. 7(*a*), the 3D IC structure 70 includes a package substrate 74, a logic die 71 including memory controller and processor circuit, and an L-HSM system 700 which includes a plurality of composite dies S12 and optionally a top-high thermal conductivity layer 706. Each composite dies S12 includes an edge-pad semiconductor die (also referred to as "memory die" or "main die") 702 and a high thermal conductivity layer (also referred to as "dummy die" or "slave die") 704. There may be another adhesive layer between the edge-pad semiconductor die 702 and the dummy die 704. In an embodiment, the number of the composite dies S12 of the HBLM shelf or stack 700 may be equal to 8, even more or even less.

As illustrated in FIG. 7(*a*), the L-HSM system 700 is electrically connected to the package substrate 74 through the logic die 71. Each semiconductor die 702 may include edge pads 701 arranged along a sidewall 702S1 in the lengthwise direction (L3) of the semiconductor die 702. The materials and configurations of the package substrate 74, the edge-pad semiconductor dies 702, the semiconductor die 704 and the top-high thermal conductivity layer 706 are similar to those of the package substrate 64, the edge-pad semiconductor dies 602, the semiconductor die 604 and the top-high thermal conductivity layer 606, respectively, and details of these features are not repeated for brevity.

As shown in FIG. 7(*a*), the SOC die (or processor circuit) is combined with the memory controller to be a single logic die, that is, the logic die 71 under the HBLM shelf 700 includes not only the memory controller 712, but also the SOC die 713 (such as GPU, CPU, NPU, TPU, FPGA, etc.), and the memory controller 712 of the logic die 71 could be disposed right under the HBLM shelf 700. In this embodiment, the logic die 71 is disposed over the packaging substrate 74 in a flip-chip manner, that is, the memory controller 712 and the SOC 713 circuits are designed at the bottom surface of the logic die 71 (shown by a dash line with a label "BEOL"). The logic die 71 further includes TSVs 711 penetrating through the logic die 71 (especially from the memory controller circuit to the HBLM shelf 700), and may include RDLs (not shown) on both sides of the optionally. Of course, there could be a heat sink (not shown) over the SOC die area, such that the top surface of the heat sink could be leveled with the top surface of the HBLM shelf 700. Similarly, FIG. 7(*a*) and FIG. 7(*b*) of this embodiment are just sketched and exemplary drawings, and the components in those drawings may not be proportional to their real sizes.

Moreover, since the HBLM shelf 700 includes the dummy die 704 (which could be a high thermal conductivity layer) between two adjacent semiconductor dies 702 and connected to a top-high thermal conductivity layer 706 on other sidewall(s) of the HBLM shelf 700, heat generated from those semiconductor dies 702 could be spread through the dummy die 704 to the top-high thermal conductivity layer 706, and passed to other heat sink (not shown) connected to the top-high thermal conductivity layer 706.

Although in this example the logic die 71 is facing downward (shown by a dash line with a label "BEOL" shown in FIG. 7(*a*)), in another example the logic die 71 could be facing upward. Since the logic die 71 includes TSVs 711 and may further include RDLs, the logic die 71 could be electrically connected to the package substrate 74 through the TSVs 711 in this embodiment. Moreover, the signal and the power connections/transmissions in the present invention could be either based on the logic die 71, or based on the package substrate 74 (through the logic die 71).

Figure 8A:
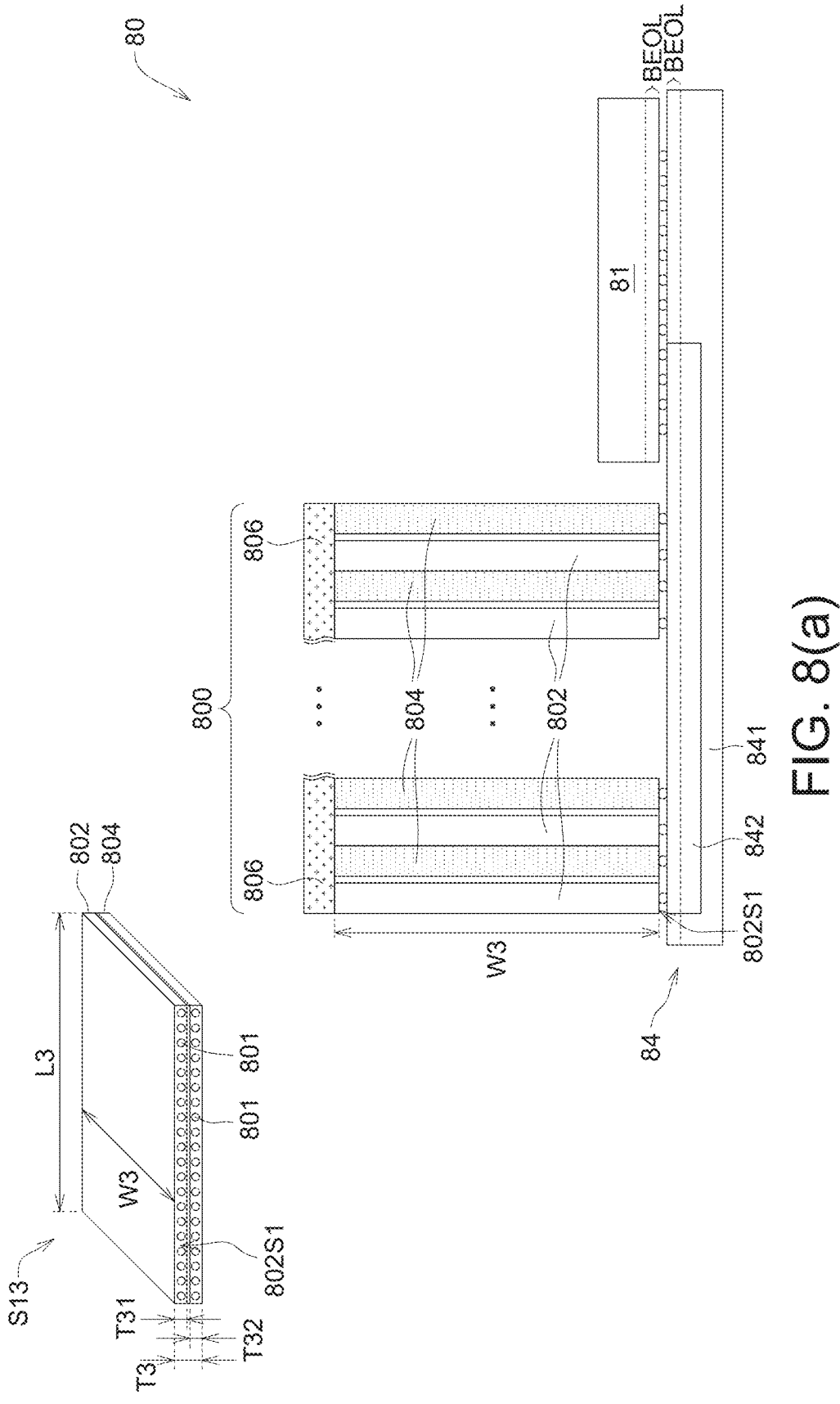
FIGS. 8(a) and 8(b) show another IC structure with L-HSM, according to some embodiments of the present disclosure.
Figure 8B:
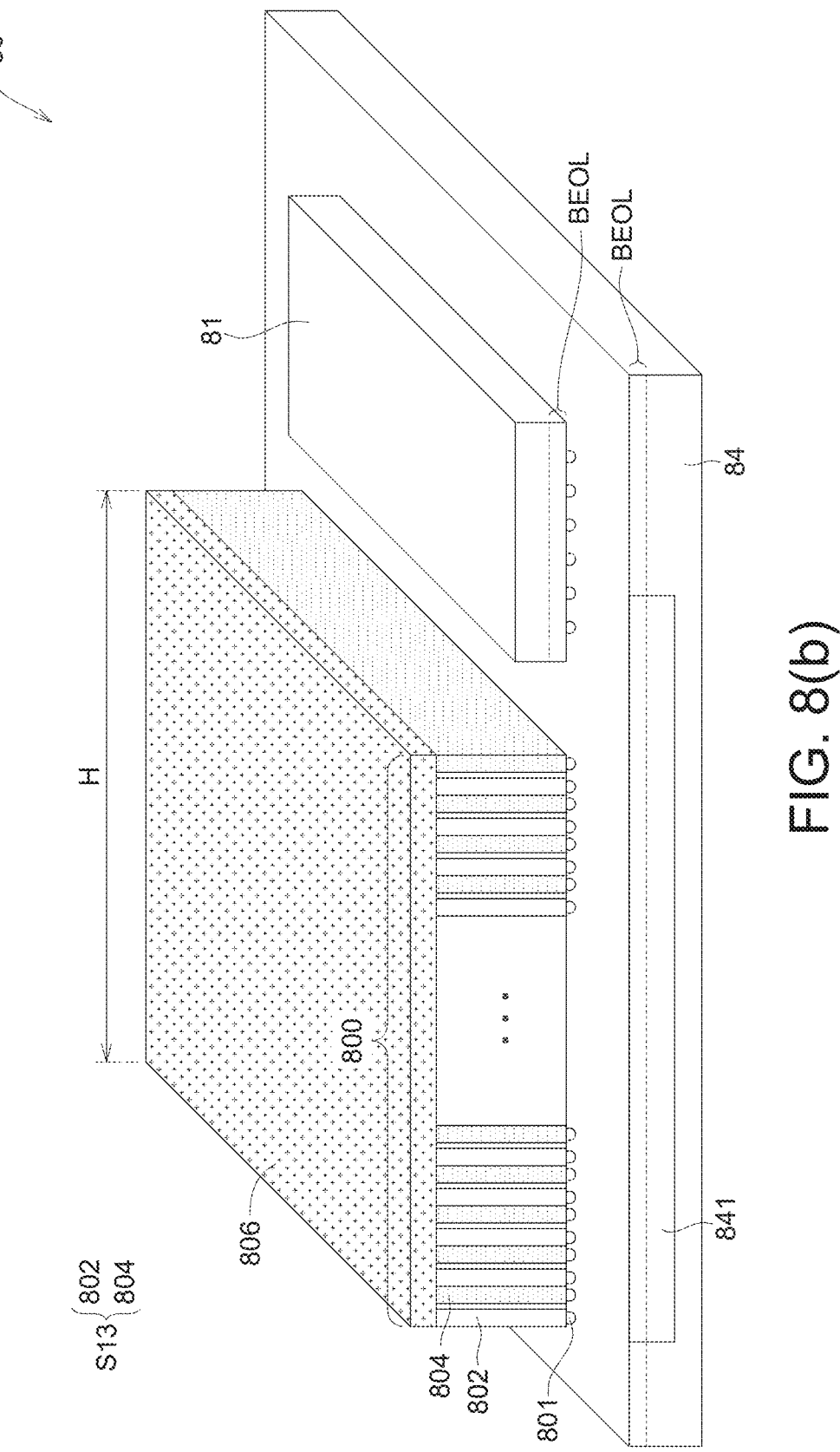

FIG. 8(*a*) shows another 3D IC structure 80 according to some embodiments of the present disclosure, and FIG. 8(*b*) is the stereoscopic view of the 3D IC structure 80. As shown in a right plot of FIG. 8(*a*), the 3D IC structure 80 includes a package substrate 84, a logic die 81 including memory controller and processor circuit, and an L-HSM system or HBLM shelf 800 which includes a plurality of composite dies S13 and optionally a top-high thermal conductivity layer 806 (also referred to as "laterally extending high thermal conductivity layer" throughout the present disclosure). Each composite dies S13 includes an edge-pad semiconductor die (also referred to as "memory die" or "main die") 802 and a high thermal conductivity layer (also referred to as "dummy die" or "slave die") 804. There may be another adhesive layer between the edge-pad semiconductor die 802 and the dummy die 804. In an embodiment, the number of the composite dies S13 of the HBLM shelf 800 may be equal to 8, even more or even less.

The HBLM shelf 800 is the same as the HBLM shelf 600 shown in FIG. 6(*a*), the materials and configurations of the semiconductor dies 802, the semiconductor die 804 and the top-high thermal conductivity layer 806 are similar to those of the semiconductor dies 602, the semiconductor die 604 and the top-high thermal conductivity layer 606, respectively, and details of these features are not repeated for brevity.

As shown in FIG. 8(*a*), the L-HSM system 800 and the logic die 81 are separately disposed on the packaging substrate 84. In some embodiments, the package substrate 84 includes a base portion 841, which is formed of a material similar to the package substrate 64 or 74, and an EMIB (Embedded Multi-die Interconnect Bridge) 842 embedded in the base portion 841, in which the EMIB 842 may be exposed from an upper surface of the base portion 841 of the package substrate 84 and used for electrical connection between the L-HSM system 800 and the logic die 81. Again, the logic die 81 is disposed over the packaging substrate 84 in a flip-chip manner, that is, the memory controller and the SOC or processor circuits are designed at the bottom surface (shown by a dash line with a label "BEOL") of the logic die 81. However, there is no TSV penetrating through the logic die 81. Of course, there could be a heat sink (not shown) over the logic die 81, such that the top surface the heat sink could be leveled with the top surface of the L-HSM system 800. Similarly, FIG. 8(*a*) and FIG. 8(*b*) of this embodiment are just sketched and exemplary drawings, the components in those drawings may not be proportional to their real sizes.

Although in this example the logic die 81 is facing downward (shown by a dash line with a label "BEOL" in FIG. 8(*a*)), in another example the logic die 81 is facing upward. Since there could be TSVs and/or RDLs (not shown) in the logic die 81, the logic die 81 could be electrically connected to the package substrate 84 through these TSVs. Moreover, the signal and the power connections/transmissions in the present invention could be either based on the logic die 81, or based on the package substrate 84.

Figure 9A:
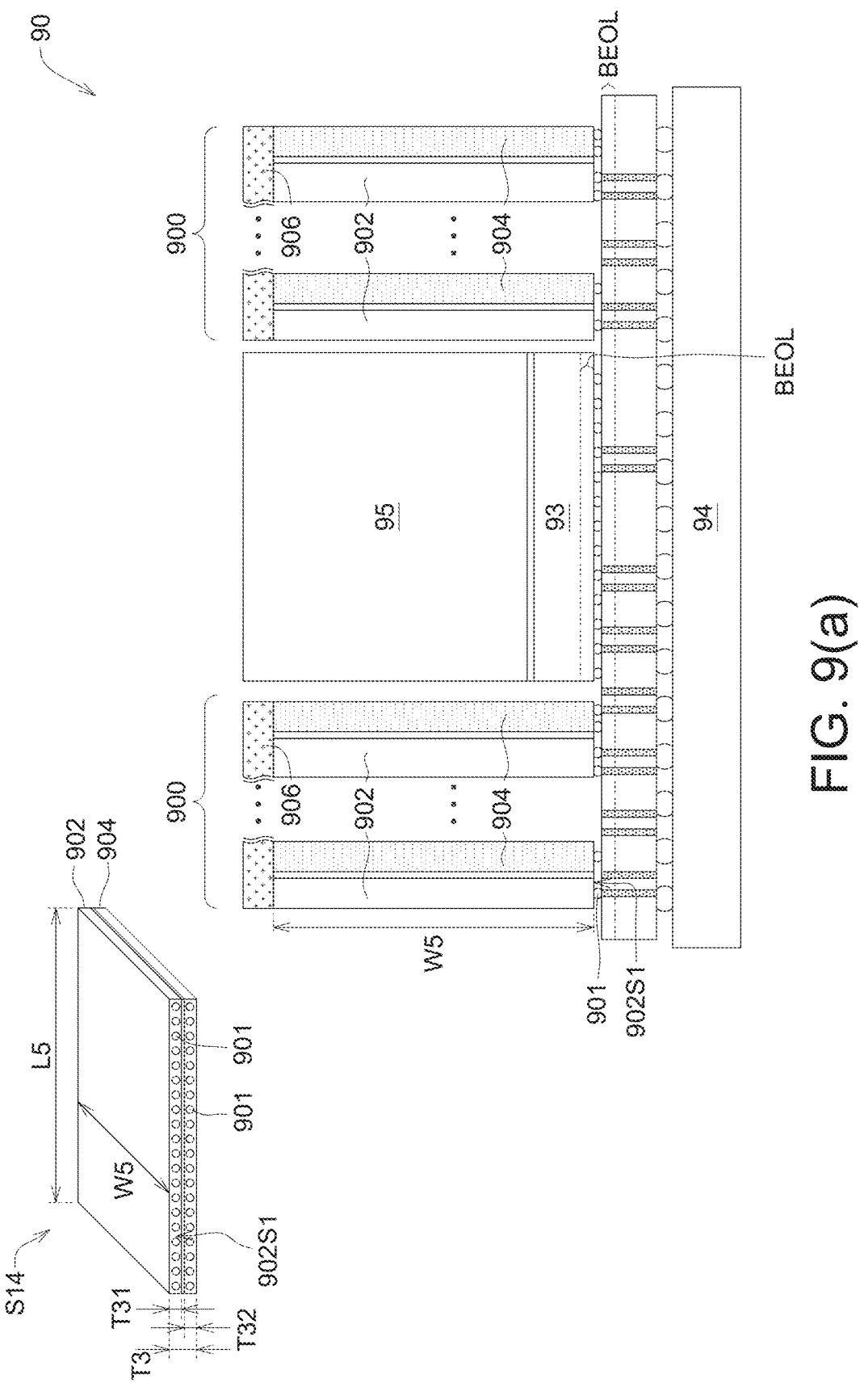
FIGS. 9(a) and 9(b) show another IC structure with multiple L-HSMs s, according to some embodiments of the present disclosure.

FIG. 9(*a*) shows another 3D IC structure 90 according to some embodiments of the present disclosure, and FIG. 9(*b*) is the stereoscopic view of the 3D IC structure 90. As shown in a right plot of FIG. 9(*a*), the 3D IC structure 90 includes a package substrate 94, a memory controller 91, a plurality of L-HSM systems 900 (each including a plurality of composite dies S14 and a top-high thermal conductivity layer 906, wherein each composite die S14 includes an edge-pad semiconductor die 902 and an dummy dies 904), an SOC chip 93 and a heat sink 95. Each L-HSM system 900 is separately and electrically bonded to the package substrate 94. Each semiconductor die 902 may include edge pads 901 arranged along a sidewall 902S1 in the lengthwise direction (L5) of the composite die S14, and each dummy die 904 may include edge pads 901 arranged along the sidewall 902S1 in the lengthwise direction (L5) of the composite die S14. The SOC chip 93 is electrically connected to the package substrate 94 through the memory controller 91. The materials and configurations of the package substrate 94, the semiconductor dies 902, the dummy die 904, the top-high thermal conductivity layer 906, the memory controller 91, the SOC chip 93 and the heat sink 95 are similar to those of the package substrate 64, the semiconductor die 602, the dummy die 604, the top-high thermal conductivity layer 606, the SOC chip 63 and the heat sink 65, respectively, and details of these features are not repeated for brevity.

Figure 9B:
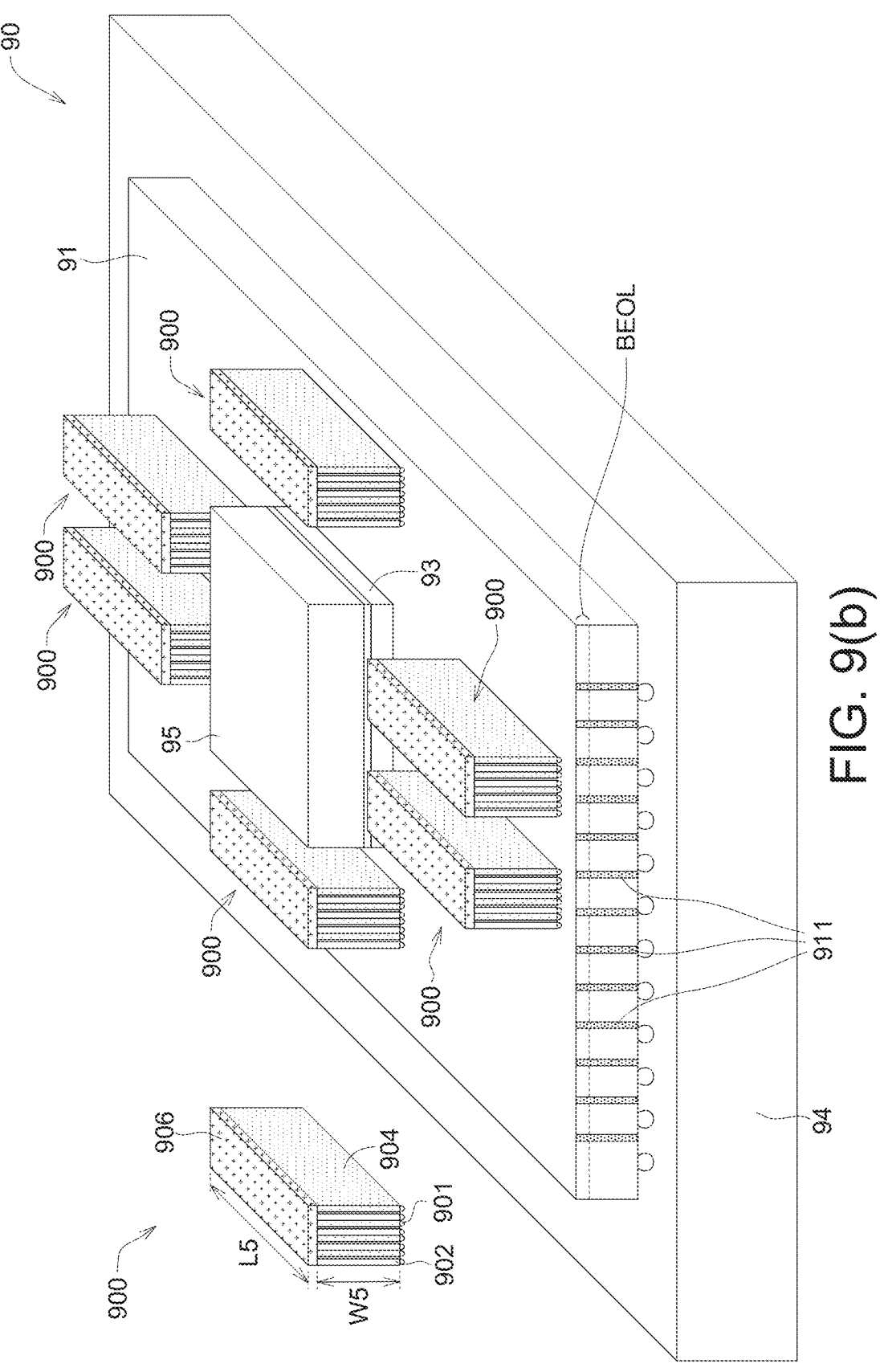

In some embodiments, twenty four (24) composite dies S14 are split into 6 L-HSM systems 900, and each L-HSM system 900 includes 4 composite dies S14. Those L-HSM systems 900 are placed on the 4 sides of the SOC die 93 (26 mm×33 mm), as shown in FIG. 9(b). Two L-HSM systems 900 are disposed along a lengthwise side (with the length of 33 mm) of the SOC die 93, another two L-HSM systems 900 are disposed along an opposite lengthwise side (with the length of 33 mm) of the SOC die 93, one L-HSM system 900 is disposed along a widthwise side (with the width of 26 mm) of the SOC die 93, and another one L-HSM system 900 is disposed along an opposite widthwise side (with the width of 26 mm) of the SOC die 93. Similarly, FIG. 9(a) and FIG. 9(b) of this embodiment are just sketched and exemplary drawings, the components in those drawings may not be proportional to their real sizes.

Of course, each L-HSM system 900 may have 6, 8, 10, or more semiconductor dies 902 and have 6, 8, 10, or more dummy dies 904 in the present invention. The following table shows the comparison between several existing HBM systems (HBM3, HBM3E and HBM4) and the proposed L-HSM systems (LHSM-1, LHSM-2, and LHSM-3):

| Product | HBM3 | HBM3E | HBM4 | LHSM-1 | LHSM-2 | LHSM-3 |
|---|---|---|---|---|---|---|
| IO Number | 1024 | 1024 | 2048 | 2048 | 4096 | 4096 |
| Data Rate (Gb/s) | 6.4 | 8 | 8 | 8 | 8 | 8 |
| Bandwidth (GB/s) | 819 | 1024 | 2048 | 2048 | 4096 | 4096 |
| Read Latency (ns) | ~25-30* | ~23-27* | ~21-24* | ~21-24 | ~21-24 | ~21-24 |
| Density / chip (Gb) | 16 | 24 | 24 | 16 | 16 | 24 |
| Stack Height (memory die numbers) | 8 / 12 | 8 / 12 | 12/ 16 | 8 | 16 | 16 |
| Capacity (GB) | 16 / 24 | 24 / 36 | 36 / 48 | 16 | 32 | 48 |

Under the above architecture to design a distributed L-HSM system 900 surrounding the 4 sides of the SOC chip 93, each semiconductor 902 is definitely achievable with today's DRAM design skills in compliance with the specification of JEDEC standard. Since these I/Os of the L-HSM system 900 are electrically connected by the advanced bonding technology such as micro-bumps or hybrid-bonding methods to the I/O's of the SOC die 93 which should use the advanced logic technology such as 3 nm or 5 nm, a high performance and low power SOC-DRAM (HBM) interface will be achieved. The power distribution system may be achieved by the vertical TSV/RDLs connections between the bottom portion of the L-HSM system 900 and the bottom portion of the SOC chip 93 in the memory controller 91 (see FIG. 9(a)), and thus a large and stable current flow system can be well established.

Figure 10:
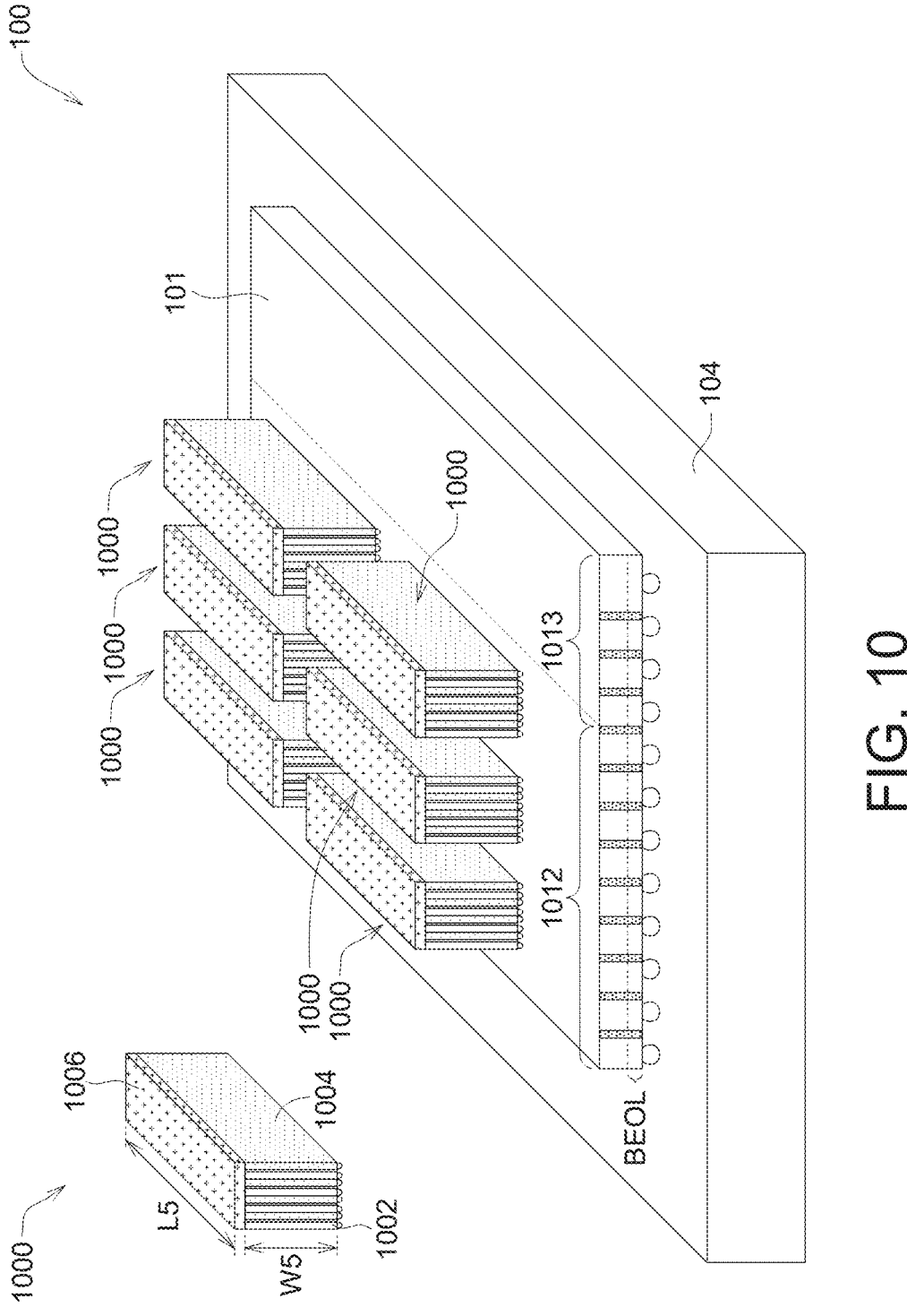
FIG. 10 shows another IC structure with multiple L-HSMs, according to some embodiments of the present disclosure.

FIG. 10 shows another 3D IC structure 100 of the present disclosure. The 3D IC structure 100 includes a package substrate 104, a logic die 101 with memory controller 1012 and SOC or processor circuit 1013, a plurality of L-HSM systems 1000 (each including a plurality of composite dies S14 and optionally a top-high thermal conductivity layer 1006, wherein each composite die S14 includes an edge-pad semiconductor dies 1002 and a dummy die 1004. Each L-HSM system 1000 is electrically connected to the package substrate 104 through the logic die 91. The materials and configurations of the package substrate 104, the semiconductor die 1002, the dummy die 1004, the top-high thermal conductivity layer 1006, and the logic die 101 are similar to those of the package substrate 74, the semiconductor die 702, the dummy die 704, the top-high thermal conductivity layer 706 and the logic die 71, respectively, and details of these features are not repeated for brevity.

Similar to FIG. 9(b), the 3D IC structure 100 in FIG. 10 may include 24 edge-pad semiconductor dies 1002 and 24 dummy dies 1004 split into 6 L-HSM systems 1000 and each L-HSM system 1000 includes 4 semiconductor dies 1002. However, unlike FIG. 9(b), the SOC circuit 1013 of this embodiment is combined with the memory controller 1012 into the logic die 101, and the 6 L-HSM systems 1000 are stacked over the logic die 101 with memory controller 1012 and SOC or processor circuit 1013. Those 6 L-HSM systems 1000 could be bonded close to the memory controller 1012, as shown in FIG. 10. Similarly, FIG. 10 of this embodiment are just sketched and exemplary drawings, the components in those drawings may not be proportional to their real sizes.

The present invention provides a 3D IC structure with at least one L-HSM system which includes a plurality of edge-pad semiconductor dies horizontally stacked together. Unlike existing HBM structures, edge pads of each semiconductor die are over the side face(s) of semiconductor die for interconnection to allow for skip-die signal and power distribution without going through other semiconductor dies. There could be no TSVs in each semiconductor die as compared with an existing DRAM chip used in HBM; therefore, it is unnecessary to perform die thinning. Moreover, the high thermal conductivity material is disposed between two adjacent semiconductor dies and optionally coupled to another high thermal conductivity material covering other side faces of the semiconductor dies. Furthermore, as shown in the previous table, each L-HSM system could more easily offer the increased number of dice with a much higher data bandwidth even based on more stringent requirements of the access latency (such as the LPDDR5 latency specification). Thus, the present invention can resolve the long-existing memory bandwidth bottleneck for data input and output from the Processor/SOC.

Furthermore, the expensive interposer is unnecessary in the 3D IC structure of the present invention. As shown in FIG. 1, in the CoWoS structure 20. the HBM structure 21 with the SOC chip 22 has all signal and power connections arranged in a flipped manner to be electrically connected to the substrate 24 through an interposer 23 with TSVs 201, which pitch is about 10 to 20 microns. However, the present invention could use memory controller and SOC circuit on a 3 nm/5 nm die, by simplifying CoWoS structure without a layer of wafer or an interposer, which is the most advanced version of integrating HBM systems on a die, in which the die serves both functions of being a memory controller and an SOC chip on the same level of silicon layer. The silicon layer has a flipped surface directly facing the substrate. Thus, the proposed new structure can be referred to as Integrated Memory System on SoC wafer on Substrate (IMSWonS).

The following summarizes advantages of the L-HSM system in contrast to the HBM specification:

(1) An HBM 4.0 die occupies a footprint area like that of an LPDDR5 HBM die with a capacity of 16 Gb (e.g. 6.25 mm×7.59 mm). However, the footprint area of the L-HSM system depends on how many units of the edge-pad semiconductor dies plus high thermal conductivity layer next to the edge-pad semiconductor die are used, for example, 24 edge-pad semiconductor dies occupy about 4.8 mm (see FIG. 7(b)) which is much smaller than the area occupied by an HBM 4.0 structure.

(2) The I/Os of the L-HSM system comes directly from each single edge-pad semiconductor die without mixing with those of other edge-pad semiconductor dies. As such, the signal can be better managed (such as less skew) than the signal coming out from 16-die stack used in the HBM4.0 framework.

(3) The capacity of L-HSM system is scalable and adaptive without worrying about the signal transmission through other DRAM dies. The capacity of L-HSM system could be extremely high, or middle-size down to lower capacity, because each semiconductor die used in the present L-HSM system has its own identity or stand-alone edge-pads, but not limited by the TSVs used in today's HBM DRAM stack.

(4) The total data bandwidth can be achieved by increasing the total number of I/Os (equal to a product of "the number I/Os from each edge-pad semiconductor die" multiplied by "the number of edge-pad semiconductor die") by using more edge-pad semiconductor dies on the shelf structure, in contrast to 1K or 2K I/Os made in the stacked dice of the HBL4.0 framework. Thus, besides driving harshly on the data rate from each I/O, the total bandwidth can be achieved by using more dice for delivering more data I/Os.

(5) Since signals are coming out from each edge-pad semiconductor die and are directly connected to the I/Os of the memory controller and later immediately operated in and out from the SOC die, the signal integrity can be significantly improved. The power for handling the I/Os can also be reduced.

What is claimed is:

1. An IC structure comprising:
a first memory stack comprising:
a plurality of semiconductor dies horizontally separate from each other, wherein each semiconductor die comprises a top surface, a bottom surface opposite to the top surface, and four sidewalls with a first sidewall, a second sidewall, a third sidewall and a fourth sidewall, and a plurality of edge pads located on the first sidewall and arranged in multiple rows or two dimensions; wherein an area of the bottom surface or the top surface is larger than that of any of the first sidewall, the second sidewall, the third sidewall and the fourth sidewall;

wherein a first part of the plurality of edge pads is located within a upper portion of the first sidewall of the semiconductor die, a second part of the plurality of edge pads is located within a lower portion of the first sidewall of the semiconductor die.

2. The IC structure of claim 1, wherein the semiconductor die includes a memory die with a die substrate, a first RDL structure over a first surface of the die substrate, a second RDL structure over a second surface of the die substrate, and a plurality of signal pads located within a seal ring of the die substrate;
wherein a first part of the plurality of signal pads is electrically connected to the first part of the plurality of edge pads through the first RDL structure, and a second part of the plurality of signal pads is electrically connected to the second part of the plurality of edge pads through the second RDL structure and a set of TSVs within the die substrate;
wherein the first RDL structure is opposite to the second RDL structure.

3. The IC structure of claim 2, wherein the first part of the plurality of edge pads are exposed from a sidewall of the first RDL structure, and the second part of the plurality of edge pads are exposed from a sidewall of the second RDL structure.

4. The IC structure of claim 2, wherein the IC structure further comprises:
an upward extending thermal conductivity layer between two adjacent semiconductor dies, wherein a thermal conductivity of the upward extending thermal conductivity layer is higher than that of SiO2.

5. The IC structure of claim 4, wherein the IC structure further comprises:
a laterally extending thermal conductivity layer covering each second sidewall of the plurality of semiconductor dies and thermally coupling to the upward extending thermal conductivity layer, wherein the laterally extending thermal conductivity layer is opposite to the first sidewalls of the plurality of semiconductor dies;
wherein the thermal conductivity of the laterally extending thermal conductivity layer is higher than that of SiO2.

6. The IC structure of claim 1, wherein the IC structure further comprises:
a logic die with memory controller under the first memory stack and electrically connected to the plurality of edge pads of each semiconductor die of the first memory stack;
a logic die with processor circuit disposed over and electrically connected to the logic die with memory controller; and
a packaging substrate under and electrically connected to the logic die with memory controller.

7. The IC structure of claim 6, further comprising:
a second memory stack comprising:
a plurality of semiconductor dies horizontally separate from each other, wherein each semiconductor die comprises a top surface, a bottom surface opposite to the top surface, and four sidewalls with a first sidewall, a second sidewall, a third sidewall and a fourth sidewall, and a plurality of edge pads located on the first sidewall and arranged in multiple rows or two dimensions;
wherein the plurality of edge pads of each semiconductor die of the second memory stack is electrically connected to the logic die with memory controller;
wherein the first memory stack and the second memory stack are horizontally spaced apart from the logic die with processor circuit, and are positioned over the logic die with memory controller;

wherein the first memory stack and the second memory stack are disposed along one side of the logic die with processor circuit, or are disposed along two sides of the logic die with processor circuit respectively.

8. The IC structure of claim 1, wherein the IC structure further comprises:

a logic die with memory controller and processor circuit under the first memory stack and electrically connected to the plurality of edge pads of each semiconductor die of the first memory stack; and a packaging substrate under and electrically connected to the logic die with memory controller and processor.

9. The IC structure of claim 8, further comprising:

a second memory stack comprising:

a plurality of semiconductor dies horizontally separate from each other, wherein each semiconductor die comprises a top surface, a bottom surface opposite to the top surface, and four sidewalls with a first sidewall, a second sidewall, a third sidewall and a fourth sidewall, and a plurality of edge pads located on the first sidewall and arranged in multiple rows or two dimensions;

wherein the plurality of edge pads of each semiconductor die of the second memory stack is electrically connected to the logic die with memory controller and processor circuit;

wherein the first memory stack and the second memory stack are horizontally spaced apart from each other, and are positioned over the logic die with memory controller and processor circuit.

10. The IC structure of claim 1, wherein the first part of the plurality of edge pads is horizontally and/or vertically shifted from the second part of the plurality of edge pads.

* * * * *